United States Patent
Harao et al.

(10) Patent No.: US 9,480,142 B2
(45) Date of Patent: Oct. 25, 2016

(54) WIRING SUBSTRATE AND MANUFACTURING METHOD THEREOF

(71) Applicant: YAZAKI CORPORATION, Minato-ku, Tokyo (JP)

(72) Inventors: Akira Harao, Makinohara (JP); Mototatsu Matsunaga, Makinohara (JP); Yasuhiro Sugiura, Makinohara (JP); Minoru Kubota, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 14/289,401

(22) Filed: May 28, 2014

(65) Prior Publication Data

US 2014/0262451 A1    Sep. 18, 2014

Related U.S. Application Data

(62) Division of application No. 13/152,419, filed on Jun. 3, 2011.

(30) Foreign Application Priority Data

Jun. 3, 2010 (JP) .................. 2010-128185
Jun. 3, 2010 (JP) .................. 2010-128186
Oct. 15, 2010 (JP) .................. 2010-232538
May 30, 2011 (JP) .................. 2011-120793

(51) Int. Cl.
*H01R 9/00* (2006.01)
*H05K 1/02* (2006.01)
(Continued)

(52) U.S. Cl.
CPC .......... *H05K 1/0204* (2013.01); *H01R 12/728* (2013.01); *H05K 1/0203* (2013.01);
(Continued)

(58) Field of Classification Search
CPC .......... H01L 2224/48091; H01L 2224/05571; H01L 23/49555; H01L 2225/1094; H01L 23/49861; H05K 2201/10757; H05K 2201/10787; H05K 7/1046
USPC .............. 361/704, 767, 772, 773, 774, 790; 174/252, 255, 260, 267, 351; 257/691, 257/696, 700, 712; 439/62, 65, 74, 79, 80, 439/637
See application file for complete search history.

(56) References Cited

U.S. PATENT DOCUMENTS 5,415,559 A    5/1995    Ichimura
5,759,050 A    6/1998    Matsuoka et al.
(Continued)

FOREIGN PATENT DOCUMENTS

CN    1298213 A    6/2001
CN    1700520 A    11/2005
(Continued)

OTHER PUBLICATIONS

Notification of Reasons for Refusal, dated Apr. 1, 2014, issued by the Japanese Patent Office in counterpart Japanese Application No. 2010-232538.
(Continued)

*Primary Examiner* — James Wu
(74) *Attorney, Agent, or Firm* — Sughrue Mion, PLLC

(57) ABSTRACT

Disclosed is wiring substrate and method of manufacturing thereof, the wiring substrate including a substrate having a high thermal conductive layer, in which at least one of a front surface and a rear surface of the substrate is a mounting surface for a variety of components; a window section formed in the substrate; and a connection terminal extended from an inside surface portion of the window section and bending in a direction perpendicular to a surface of the substrate.

6 Claims, 32 Drawing Sheets

(51) Int. Cl.
*H01R 12/72* (2011.01)
*H05K 3/36* (2006.01)
*H05K 1/11* (2006.01)
*H05K 3/10* (2006.01)
*H01L 23/498* (2006.01)
*H05K 7/10* (2006.01)
*H05K 1/05* (2006.01)
*H05K 3/20* (2006.01)
*H05K 3/34* (2006.01)
*H05K 1/14* (2006.01)

(52) U.S. Cl.
CPC ............. *H05K 1/11* (2013.01); *H05K 3/10* (2013.01); *H05K 3/368* (2013.01); *H01L 23/49861* (2013.01); *H01L 2224/05571* (2013.01); *H01L 2224/48091* (2013.01); *H01L 2225/1094* (2013.01); *H05K 1/05* (2013.01); *H05K 1/056* (2013.01); *H05K 1/14* (2013.01); *H05K 3/202* (2013.01); *H05K 3/3447* (2013.01); *H05K 7/1046* (2013.01); *H05K 2201/09063* (2013.01); *H05K 2201/10757* (2013.01); *H05K 2201/10787* (2013.01); *H05K 2203/025* (2013.01); *Y10T 29/49147* (2015.01); *Y10T 29/49155* (2015.01)

(56) References Cited

U.S. PATENT DOCUMENTS

| | | | |
|---|---|---|---|
| 6,155,856 | A | 12/2000 | Sanada |
| 7,186,136 | B2 * | 3/2007 | Tiesler et al. ............... 439/493 |
| 2005/0048825 | A1 | 3/2005 | Hiwatashi |
| 2005/0056457 | A1 | 3/2005 | Gall et al. |
| 2005/0231897 | A1 | 10/2005 | Yamashita |

FOREIGN PATENT DOCUMENTS

| | | | |
|---|---|---|---|
| EP | 1107400 | A1 | 2/2000 |
| JP | 6447079 | U | 3/1969 |
| JP | 1-187995 | A | 7/1989 |
| JP | 2-199894 | A | 8/1990 |
| JP | 2199894 | A | 8/1990 |
| JP | 3119793 | A | 5/1991 |
| JP | 4-137790 | A | 5/1992 |
| JP | 5-13906 | A | 1/1993 |
| JP | 6-132044 | A | 5/1994 |
| JP | 6-275328 | A | 9/1994 |
| JP | 7153889 | A | 6/1995 |
| JP | 8-7390 | A | 1/1996 |
| JP | 8-227736 | A | 9/1996 |
| JP | 9-97958 | A | 4/1997 |
| JP | 9-298344 | A | 11/1997 |
| JP | 9298344 | A | 11/1997 |
| JP | 10261503 | A | 9/1998 |
| JP | 10-303522 | A | 11/1998 |
| JP | 10303522 | A * | 11/1998 | ............... H05K 1/02 |
| JP | 1145964 | A | 2/1999 |
| JP | 200022303 | A | 1/2000 |
| JP | 2000-164276 | A | 6/2000 |
| JP | 2001-25137 | A | 1/2001 |
| JP | 2001-319701 | A | 11/2001 |
| JP | 2002111260 | A | 4/2002 |
| JP | 2002-186141 | A | 6/2002 |
| JP | 2004356436 | A | 12/2004 |
| JP | 2005-72385 | A | 3/2005 |
| JP | 2005072385 | A * | 3/2005 | ............... H05K 7/06 |
| JP | 2005-312130 | A | 11/2005 |
| JP | 2006-512785 | A | 4/2006 |
| JP | 2006-333583 | A | 12/2006 |

OTHER PUBLICATIONS

Communication issued Jun. 25, 2013; the State Intellectual Property Office of the P.R.C.; corresponding to application No. 201110149817.1.
Office Action dated Jan. 7, 2014 issued by the Japanese Patent Office in counterpart Japanese Patent Application No. 2010128185.
Office Action dated Nov. 11, 2014 issued by Japanese Patent Office in counterpart Japanese Patent Application No. 2011-120793.
Office Action dated Nov. 4, 2014 issued by Japanese Patent Office in counterpart Japanese Patent Application No. 2010-232538.
Office Action dated Mar. 3, 2015 issued by Japanese Patent Office in counterpart Japanese Patent Application No. 2011-120793.

* cited by examiner

WIRING SUBSTRATE AND MANUFACTURING METHOD THEREOF

CROSS-REFERENCE TO RELATED APPLICATIONS

This is a Divisional Application of U.S. application Ser. No. 13/152,419 filed Jun. 3, 2011, which claims priority from Japanese Patent Application No. 2010-128185 filed on Jun. 3, 2010, Japanese Patent Application No. 2010-128186 filed on Jun. 3, 2010, Japanese Patent Application No. 2010-232538 filed on Oct. 15, 2010 and Japanese Patent Application No. 2011-120793 filed on May 30, 2011, the disclosures of which are incorporated herein by reference in their entirety.

BACKGROUND OF THE INVENTION

1. Field of the Invention

The present invention relates to a wiring substrate on which a variety of electric and electronic components are mounted and a manufacturing method thereof.

2. Description of the Related Art

In the related art, there has been proposed a wiring substrate on which a variety of electric and electronic components are mounted, which has a connection terminal which is mounted and extended on a mounting surface of the substrate, and in which the connection terminal is connected to another wiring substrate, for example. For example, there have been proposed a structure in which a lead terminal is inserted and fixed in each through-hole of each substrate to connect the substrates (for example, refer to Patent Document 1), a structure in which in a circuit board which is integrally formed with a metal plate which is die-cut in a wiring pattern shape and a composite insulation material of high thermal conductivity in a state where at least a mounting portion of each electronic component is exposed, a part of the metal plate is used as an external connection terminal for connection with a different circuit board and the circuit board is easily position-controlled by a convex section disposed in the external connection terminal (for example, refer to Patent Document 2), and the like. In the circuit board in Patent Document 2, heat of mounted components is diffused by the metal plate and radiated by the composite insulation material.

Further, as shown in FIG. 48, a wiring substrate 4 is known in which a connector 2 is disposed on a mounting surface 1a of a substrate 1 and a connection terminal 3 of the connector 2 is upright installed on the mounting surface 1a of the substrate 1 for connection (for example, refer to Patent Document 3).

Patent Document 1: JP-A-6-275328
Patent Document 2: JP-A-10-303522
Patent Document 3: JP-A-2006-333583

As described above, as the wiring substrates are installed in parallel by connection through the connection terminals, it is possible to achieve high density mounting. However, with such a high density mounting, there is a problem in that insufficient heat radiation occurs since a heat radiation effect is achieved by only the substrates with the metal plate and the composite insulation material of high thermal conductivity.

Also recently, alongside the miniaturization of devices, there is demand for the miniaturization and thinning of a wiring substrate which is mounted in a device.

However, as in the wiring substrate disclosed in JP-A-6-275328 and JP-A-10-303522, if the connection terminal is installed on the mounting surface on which electric and electronic components are mounted, the size of the substrate has to be enlarged to mount necessary electric and electronic components thereon since the mounting surface of the substrate is occupied by the connection terminal. Further, in the wiring substrate disclosed in JP-A-2006-333583, since the connector is disposed on the mounting surface, the height is increased, and thus, it is difficult to achieve miniaturization of a substrate.

SUMMARY OF THE INVENTION

That is, in order to achieve high density mounting of electric and electronic components by installing the wiring substrates, for example, it is necessary to achieve a higher heat radiation effect.

Accordingly, an object of the present invention is to provide a wiring substrate and a manufacturing method thereof in which a high heat radiation effect can be obtained and high density mounting can be achieved.

Also, an object of the present invention is to provide a wiring substrate which is capable of being made smaller and thinner, and a manufacturing method thereof.

In order to achieve the object of the present invention, the wiring substrate of the invention is characterized by configurations (1) to (8).

(1) A wiring substrate, comprising a substrate which has a high thermal conductive layer in which at least one of a front surface and a rear surface of the substrate is a mounting surface for a variety of components, a connection terminal which is extended from the substrate and bends in a direction perpendicular to a surface of the substrate, and a heat radiation piece section which is integrally installed to the connection terminal.

(2) The wiring substrate according to (1), wherein the substrate includes a metal core substrate in which insulation layers are formed on the front and rear of a metal core which is a high thermal conductive layer.

(3) The wiring substrate according to (1), wherein a bending portion of the connection terminal is a curved section which bends in an arc shape when seen from a side surface thereof.

(4) The wiring substrate according to (1), wherein the high thermal conductive layer and the connection terminal are formed in the same layer.

(5) The wiring substrate according to (1), wherein the plurality of connection terminals are installed, and at least two connection terminals in the plurality of the connection terminals are electrically connected in the substrate.

(6) The wiring substrate according to (1), wherein a concave section is formed in at least one side edge part of the substrate, and the connection terminal is extended from a side surface section of the concave section.

(7) The wiring substrate according to (1), wherein a window section is formed in the substrate, and the connection terminal is extended from an inside surface portion of the window section.

(8) The wiring substrate according to (1), wherein the connection terminal is connected to another wiring substrate which is installed at an interval in respect to the substrate.

In the wiring substrate of the above-described configuration (1), since the connection terminal in which the heat radiation piece section is integrally formed and its surface area is enlarged is disposed in the substrate having the high thermal conductive layer, it is possible to achieve a heat radiation effect of the substrate itself and a heat radiation effect through the connection terminal. Thus, for example, even though high density mounting is attempted by connecting a variety of heat generating components or another substrate to the connection terminal, it is possible to achieve a sufficient heat radiation effect. That is, it is possible to achieve high density mounting while remarkably enhancing the heat radiation effect.

Further, since the good heat radiation effect can be obtained in the connection terminal, it is possible to reliably suppress heat transfer to connection locations through soldering or the like of components of the connection terminal and another substrate. Thus, it is possible to prevent the connection locations of the connection terminal from deteriorating due to heat that causes disconnection, and to maintain reliability of connection.

In the wiring substrate of the above-described configuration (2), since the substrate includes the metal core substrate in which the insulation layers are formed on the surfaces of the metal core, heat of mounted components is distributed by the metal core to thereby reliably perform the heat radiation.

In the wiring substrate of the above-described configuration (3), since the connection terminal bends in a direction perpendicular to the surface of the substrate and the bending portion is formed the curved section which bends in the arc shape when seen from the side surface, external forces or stress applied to the connection terminal can be desirably absorbed by the curved section. Further, it is possible to prevent a problem such that excessive force is applied to a fixing portion of the connection terminal to the substrate or a connection portion of the connection terminal to other components, another substrate, or the like causing deterioration.

In the wiring substrate of the above-described configuration (4), since the high thermal conductive layer and the connection terminal can be formed in the same layer, it is possible to manufacture the high thermal conductive layer and the connection terminal in the same process, to thereby simplify the manufacturing process of the wiring substrate.

In the wiring substrate of the above-described configuration (5), since at least two connection terminals in the connection terminals are electrically connected to each other, it is not necessary to arrange the circuit pattern for connecting two connection terminals on the surface of the substrate, and it is possible to reduce the space of the substrate on which a variety of components are mounted, and to achieve miniaturization of the wiring substrate.

In the wiring substrate of the above-described configuration (6), since the connection terminal is extended from the side surface section of the concave section formed in at least one side edge part of the substrate, it is possible to reliably suppress occupation of the mounting surface through the connection terminal to thereby reduce the size, compared with the case where the connection terminal is installed on the mounting surface. Further, for example, even in a case where the connection terminal is accommodated in a component such as a connector, since the component can be disposed in the concave section, it is possible to suppress the height, compared with the case where the component is disposed on the mounting surface.

In the wiring substrate of the above-described configuration (7), since the window section is formed in the substrate having the high thermal conductive layer to enhance a ventilation characteristic, it is possible to obtain a heat radiation effect through the window section, in addition to a heat radiation effect through the substrate itself and a heat radiation effect through the heat radiation piece section of the connection terminal. Thus, for example, even though high density mounting is performed by installing another substrate to the connection terminal which is extended from the inside surface portion of the window section, it is possible to achieve a sufficient heat radiation effect.

In the wiring substrate of the above-described configuration (8), since the connection terminal in which the heat radiation piece section is formed is installed on the substrate having a high heat radiation property to remarkably enhance the heat radiation effect, even in a state where another wiring substrate is installed in parallel for high density mounting, it is possible to obtain a sufficient heat radiation effect and to reliably suppress heat transfer through the connection terminal to another wiring substrate.

Further, according to another embodiment of the present invention, there is provided a method of manufacturing a wiring substrate having the following configuration (9).

(9) A method of manufacturing a wiring substrate which includes a substrate having a high thermal conductive layer in which at least one of a front surface and a rear surface of the substrate is a mounting surface for a variety of components, a connection terminal which is extended from the substrate and bends in a direction perpendicular to a surface of the substrate, and a heat radiation piece section which is integrally formed to the connection terminal, the method including a substrate forming process of stacking insulation layers on front and rear surfaces of a conductive metal plate which becomes the connection terminal to form the substrate; a metal plate exposing process of removing the insulation layers in a part of the substrate to expose the metal plate; and a connection terminal forming process of processing the exposed metal plate to form the connection terminal in which the heat radiation piece section protrudes in a side direction.

In the manufacturing method of the wiring substrate of the above-described configuration (9), it is possible to easily manufacture the wiring substrate of a high heat radiation property. Further, since the connection terminal is formed so that the heat radiation piece section protrudes in the side direction thereof, it is possible to form the heat radiation piece section in a peripheral blank portion of the connection terminal which is discarded when the connection terminal is formed. Thus, it is possible to effectively use the metal plate when the connection terminal is formed, and to enhance the heat radiation effect at low cost by reducing unnecessary waste.

In order to achieve the object of the present invention, the wiring substrate of the invention is characterized by configurations (10) to (15).

(10) A wiring substrate, comprising a substrate which has a high thermal conductive layer in which at least one of a front surface and a rear surface thereof is a mounting surface for a variety of components; a window section which is formed in the substrate; and a connection terminal which is extended from an inside surface portion of the window section and bends in a direction perpendicular to a surface of the substrate.

(11) The wiring substrate according to the configuration (10), wherein the substrate includes a metal core substrate in which insulation layers are formed on the front and rear of a metal core which is a high thermal conductive layer.

(12) The wiring substrate according to the configuration (10), wherein a bending portion of the connection terminal is a curved section which bends in an arc shape when seen from a side surface thereof.

(13) The wiring substrate according to the configuration (10), wherein a plurality of the connection terminals is installed in an inside surface portion of the window section in a longitudinal direction, and at least two connection terminals of the plurality of the connection terminals are electrically connected with each other inside the substrate.

(14) The wiring substrate according to the configuration (10), wherein the high thermal conductive layer and the connection terminal are formed in the same layer.

(15) The wiring substrate according to the configuration (10), wherein the connection terminal is connected to another wiring substrate which is installed in parallel at an interval to the substrate.

In the wiring substrate of the above-described configuration (10), since a window section is formed in the high radiation substrate having the high thermal conductive layer to enhance a ventilation characteristic, it is possible to achieve a heat radiation effect of the substrate itself and a heat radiation effect through the window section. Thus, for example, even though high density mounting is attempted by connecting another substrate to the connection terminal which is extended from an inside surface portion of the window section, it is possible to achieve a sufficient heat radiation effect. That is, it is possible to achieve high density mounting while remarkably enhancing the heat radiation effect.

In the wiring substrate of the above-described configuration (11), since the substrate includes the metal core substrate in which the insulation layers are formed on the surfaces of the metal core, heat of mounted components is distributed by the metal core to thereby reliably perform the heat radiation.

In the wiring substrate of the above-described configuration (12), since the connection terminal bends in a direction perpendicular to the surface of the substrate and the bending portion is formed the curved section which bends in the arc shape when seen from the side surface, external forces or stress applied to the connection terminal can be desirably absorbed by the curved section. Further, it is possible to prevent a problem such that excessive force is applied to a fixing portion of the connection terminal to the substrate or a connection portion of the connection terminal to other components, another substrate, or the like causing deterioration.

In the wiring substrate of the above-described configuration (13), since at least two connection terminals in the connection terminals are electrically connected to each other, it is not necessary to arrange the circuit pattern for connecting two connection terminals on the surface of the substrate, and it is possible to reduce the space of the substrate on which a variety of components are mounted, and to achieve miniaturization of the wiring substrate.

In the wiring substrate of the above-described configuration (14), since the high thermal conductive layer and the connection terminal can be formed in the same layer, it is possible to manufacture the high thermal conductive layer and the connection terminal in the same process, to thereby simplify the manufacturing process of the wiring substrate.

In the wiring substrate of the above-described configuration (15), since the window section is formed in the substrate having the high thermal conductive layer to enhance the heat radiation effect, it is possible to obtain a heat radiation effect through the window section, in addition to a heat radiation effect through the substrate itself and a heat radiation effect through the heat radiation piece section of the connection terminal. Thus, for example, even though high density mounting is performed by installing another substrate to the connection terminal which is extended from the inside surface portion of the window section, it is possible to achieve a sufficient heat radiation effect.

Further, according to another embodiment of the present invention, there is provided a method of manufacturing a wiring substrate having the following configuration (16).

(16) A method of manufacturing a wiring substrate which includes a substrate having a high thermal conductive layer in which at least one of a front surface and a rear surface thereof is a mounting surface for a variety of components, a window section which is formed on the substrate, and a connection terminal which is extended from an inside surface portion of the window section and bent in a direction perpendicular to a surface of the substrate, the method comprising:

a substrate forming process of stacking insulation layers on front and rear surfaces of a conductive metal plate which becomes the connection terminal to form the substrate;

a metal plate exposing process of removing the insulation layers from a portion of the substrate in which the window section is to be formed, to expose the conductive metal plate; and a connection terminal forming process of processing the exposed conductive metal plate to form the window section and the connection terminal.

In the manufacturing method of the wiring substrate with the above-described configuration (16), it is possible to easily manufacture the wiring substrate which can be mounted at high density and has a high heat radiation property, in which the window section is formed in the substrate and the connection terminal is extended from the inside surface portion of the window section.

In order to achieve the object of the present invention, the wiring substrate of the invention is characterized by configurations (17) to (23).

(17) A wiring substrate comprising: a substrate in which at least one of a front surface and a rear surface thereof is a mounting surface for a variety of components; a concave section which is formed at at least one side edge part of the substrate; and a connection terminal which is extended from a side surface portion of the concave section and bends in a direction perpendicular to a surface of the substrate, wherein the connection terminal is disposed inside the side surface of the substrate.

(18) The wiring substrate according to the configuration (17), wherein a bending portion of the connection terminal is a curved section which bends in an arc shape when seen from a side surface thereof.

(19) The wiring substrate according to the configuration (17), wherein a plurality of the connection terminals is installed in a side surface portion of the concave section in a longitudinal direction, and at least two connection terminals of the plurality of the connection terminals are electrically connected in the substrate.

(20) The wiring substrate according to the configuration (17), wherein the substrate includes a high thermal conductive layer, and the high thermal conductive layer and the connection terminal are formed in the same layer.

(21) The wiring substrate according to the configuration (17), wherein the connection terminal is connected to another wiring substrate which is installed in parallel at an interval to the substrate.

(22) The wiring substrate according to the configuration (17), wherein a support piece, which supports another wiring substrate in a position at an interval to the substrate, is provided in the connection terminal so as to protrude in a side direction thereon.

(23) The wiring substrate according to the configuration (17), wherein a housing which forms a connector is disposed in the concave section, and the connection terminal is accommodated in the housing.

In the wiring substrate of the above-described configuration (17), since the connection terminal is extended from the side surface portion of the concave section formed in at least one side edge part of the substrate and bent in a direction perpendicular to the surface of the substrate, it is possible to reliably suppress occupation of the mounting surface by the connection terminal to thereby reduce the size, compared with the case where the connection terminal is installed on the mounting surface. Further, for example, even in a case where the connection terminal is accommodated in a component such as a connector, since the component can be disposed in the concave section, it is possible to suppress the height, compared with the case where the component is disposed on the mounting surface. That is, this configuration is suitable for a wiring substrate which is to be mounted in a device which is required to be made smaller and thinner.

In the wiring substrate of the above-described configuration (18), since the bending portion of the connection terminal is the curved section which is formed in an arc shape when seen from a side surface thereof, external forces or stress applied to the connection terminal can be desirably absorbed by the curved section. Further, it is possible to prevent such a problem in that excessive force is applied to a fixing portion of the connection terminal to the substrate or a connection portion of the connection terminal to other components or another substrate that causes deterioration.

In the wiring substrate of the above-described configuration (19), since at least two connection terminals in the connection terminals are electrically connected, it is not necessary to arrange the circuit pattern for connecting two connection terminals on the surface of the substrate, and it is possible to reduce a space of the substrate on which a variety of components are mounted, and to achieve miniaturization of a wiring substrate.

In the wiring substrate of the above-described configuration (20), since the high thermal conductive layer and the connection terminal can be formed in the same layer, it is possible to manufacture the high thermal conductive layer and the connection terminal in the same process, to thereby simplify the manufacturing process of the wiring substrate.

In the wiring substrate of the above-described configuration (21), since the connection terminal is extended from the side surface portion of the concave section of the substrate, it is possible to use a wiring substrate which has the same or smaller size as another wiring substrate which is installed in parallel in the wiring substrate, to thereby reduce the size.

In the wiring substrate of the above-described configuration (22), it is possible to support another wiring substrate to be positioned at the predetermined interval without using a component such as a spacer or a jig. Thus, in a case where another wiring substrate is installed in parallel to the wiring substrate, it is possible to easily dispose another wiring substrate in a position at the predetermined interval with respect to the wiring substrate for connection with the connection terminal through soldering. Accordingly, it is possible to reduce time for the connection work of another wiring substrate to thereby reduce the manufacturing cost.

In the wiring substrate of the above-described configuration (23), since the housing which forms the connector is disposed in the concave section, it is possible to suppress the height to achieve a thin thickness, compared with the case where the housing is disposed on the mounting surface.

Further, according to another embodiment of the present invention, there is provided a method of manufacturing a wiring substrate having the following configuration (24) or (25).

(24) A method of manufacturing a wiring substrate which includes a substrate in which at least one of a front surface and a rear surface thereof is a mounting surface for a variety of components, a concave section which is formed at at least one side edge part of the substrate, and a connection terminal which is extended from a side surface portion of the concave section and bends in a direction perpendicular to a surface of the substrate, the method including: a substrate forming processes of stacking insulation layers on the front and rear of a conductive metal plate which becomes the connection terminal to form the substrate; a metal plate exposing process of removing the insulation layers in a formation portion of the concave section of the substrate to expose the metal plate; and a connection terminal forming process of processing the exposed metal plate to form the concave section and the connection terminal.

(25) In the method of manufacturing the wiring substrate according to the configuration (24), a support piece which protrudes in a side direction is formed in the connection terminal in the connection terminal forming process.

In the manufacturing method of the wiring substrate of the above-described configuration (24), it is possible to easily manufacture the wiring substrate capable of being made smaller in size and thinner in thickness, in which the connection terminal is extended from the side surface portion of the concave section which is formed at at least one side edge part of the substrate. In the manufacturing method of the wiring substrate of the above-described configuration (25), since the connection terminal in which the support piece protrudes in opposite directions is formed, it is possible to easily manufacture the wiring substrate in which another wiring substrate can be positioned for easy connection in the connection terminal forming process.

According to the present invention, it is possible to obtain a high heat radiation effect, and to provide a wiring substrate and a manufacturing method thereof in which high density mounting is possible.

Hereinbefore, the present invention has been briefly described. Further, embodiments of the present invention will be described hereinafter with reference to the accompanying drawings, which will further clarify details of the present invention.

BRIEF DESCRIPTION OF THE DRAWINGS

FIGS. 43A and 43B are diagrams illustrating a state where another wiring substrate is installed in parallel to the wiring substrate according to the modification of the embodiment, in which FIG. 43A is a perspective view when seen from a lower side in a support location of another wiring substrate and FIG. 43B is a side view thereof.

DESCRIPTION OF THE PREFERRED EMBODIMENTS

Hereinafter, embodiments according to the invention will be described with reference to the accompanying drawings.

First Embodiment

Figure 1:
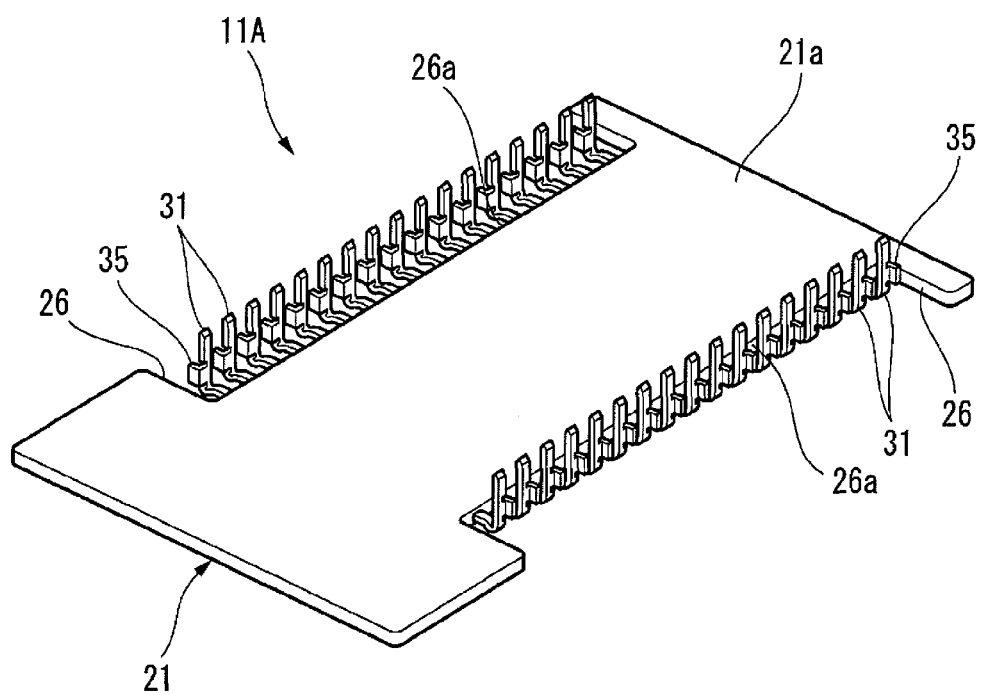
FIG. 1 is a perspective view of a wiring substrate according to a first embodiment of the invention.
Figure 2:
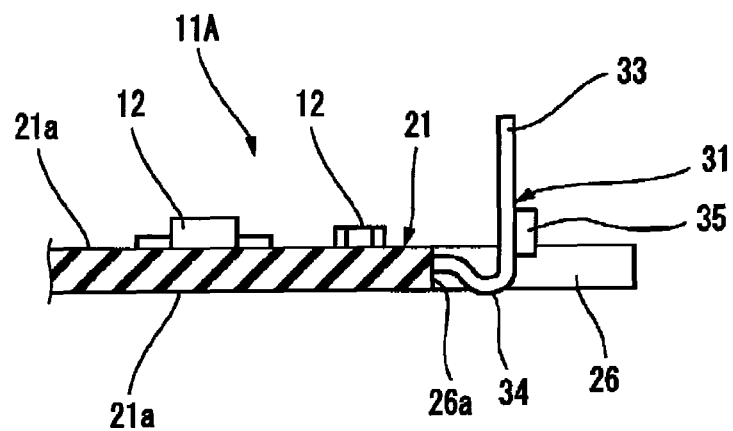
FIG. 2 is a cross-sectional view illustrating a part of the wiring substrate according to the first embodiment of the invention.
Figure 3:
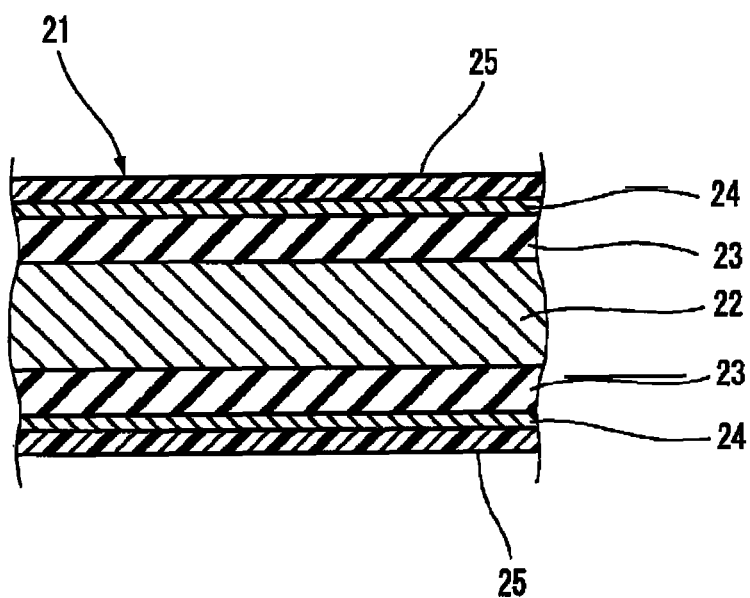
FIG. 3 is a cross-sectional view illustrating a structure of a substrate which forms a wiring substrate.
Figure 4:
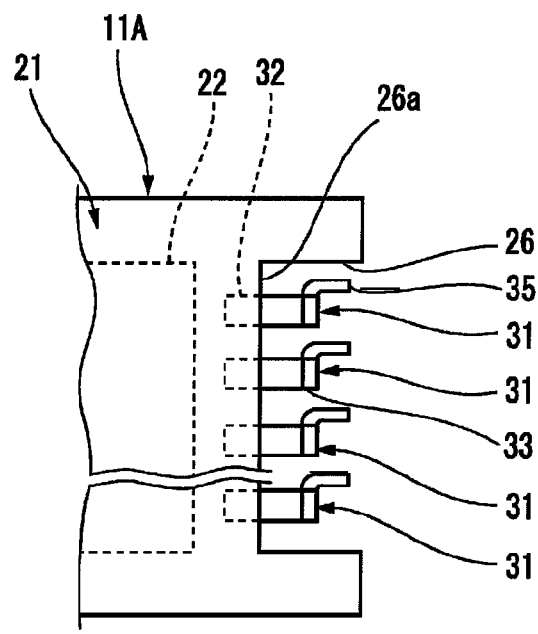
FIG. 4 is a plan view illustrating a part of the wiring substrate.
Figure 5:
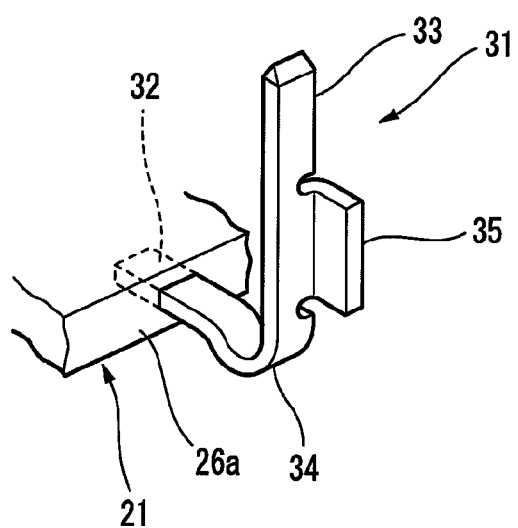
FIG. 5 is a perspective view illustrating a connection terminal portion of the wiring substrate.

FIG. 1 is a perspective view illustrating a wiring substrate according to a first embodiment of the invention, FIG. 2 is a cross-sectional view illustrating a part of the wiring substrate according to the first embodiment of the invention, FIG. 3 is a cross-sectional view illustrating a structure of a substrate which forms the wiring substrate, FIG. 4 is a plan view illustrating a part of the wiring substrate, and FIG. 5 is a perspective view illustrating a connection terminal portion of the wiring substrate.

As shown in FIGS. 1 and 2, a wiring substrate 11A in the first embodiment includes a high heat radiation substrate (hereinafter, referred to as a "substrate") 21 and a plurality of connection terminals 31 which are disposed on the high heat radiation substrate 21.

As shown in FIG. 3, the substrate 21 includes a plate-shaped metal core (high thermal conductive layer) 22 which is formed of copper, copper alloy or the like in the center in a thickness direction, and insulation layers 23 which are formed of synthetic resin having thermosetting and insulating properties on front and rear surfaces of the metal core 22. Further, a circuit pattern 24 is formed on a surface of the insulation layer 23, and a surface of the circuit pattern 24 is covered by a resist layer 25. That is, the substrate 21 is a metal core substrate (high heat radiation substrate) having heat radiation and heat distributing properties by installation of the metal core 22, its front and rear surfaces are formed as mounting surfaces 21a having the circuit patterns 24, as shown in FIG. 2. A variety of electric and electronic components 12 are mounted on the mounting surface 21a. Heat of the electric and electronic components 12 generated in the substrate 21 which is the metal core substrate is smoothly distributed by the metal core 22 and is radiated outside.

As shown in FIGS. 1 and 4, a concave section 26 is respectively formed on opposite side edge parts of the substrate 21, and the plurality of connection terminals 31 are extended in an aligned state from a side surface portion 26a of the concave section 26 in a longitudinal direction. The connection terminals 31 are electrically connected with the circuit patterns 24 by through-holes (not shown) formed in the substrate 21, for example.

Since the connection terminal 31 is made of the same conductive metallic material as the metal core 22, such as copper or copper alloy, the connection terminal 31 is disposed and fixed between the insulation layers 23, and is formed in the same layer as the metal core 22.

As shown in FIGS. 2, 4 and 5, the connection terminal 31 includes a fixing section 32 which is fixed to the substrate 21 and a terminal section 33 which is extended from the side surface portion 26a of the concave section 26. The terminal section 33 bends upward to be perpendicular to the surface of the substrate 21, and the bending portion of the terminal section 33 of the connection terminal 31 is formed as a curved section 34 which is formed in an arc shape when seen from a side surface. The connection terminal 31 is disposed so that the terminal section 33 thereof is positioned inside the side surface of the substrate 21.

Further, a heat radiation piece section 35 is integrally installed to the terminal section 33 of the connection terminal 31. Since the heat radiation piece section 35 is formed to the terminal section 33 of the connection terminal 31 by a press working, the heat radiation piece section 35 is extended from one side of the terminal section 33 in a side direction.

As the heat radiation piece section 35 is formed, the connection terminal 31 has a large surface area in a portion exposed outside, and thus, its heat radiation property is remarkably enhanced.

In the wiring substrate 11A having such a configuration, for example, the connection terminal 31 is connected to another wiring substrate, or a component such as a connector is installed to the connection terminal 31.

According to the wiring substrate 11A, since the connection terminal 31 in which the heat radiation piece section 35 is integrally formed and its surface area is enlarged is disposed in the substrate 21 including the metal core substrate in which the insulation layers 23 are installed on the front and rear surfaces of the metal core 22 which is the high thermal conductive layer, it is possible to achieve a heat radiation effect of the substrate 21 itself and a heat radiation effect through the connection terminal 31. That is, even in a case where the substrate 21 which is the metal core substrate and the connection terminal 31 are distant from each other, the heat radiation effect of the connection terminal 31 can be obtained by the heat radiation piece section 35. Thus, for example, even though high density mounting is attempted by connecting a variety of heat generating components or another substrate to the connection terminal 31, it is possible to achieve a sufficient heat radiation effect. That is, it is possible to achieve high density mounting while remarkably enhancing the heat radiation effect.

Further, since the good heat radiation effect can be obtained in the connection terminal 31, it is possible to reliably suppress heat transfer to connection locations through soldering or the like of components of the connection terminal 31 and another substrate. Thus, it is possible to prevent the connection locations of the connection terminal 31 from deteriorating due to heat that causes disconnection, and to maintain reliability of connection.

Figure 6:
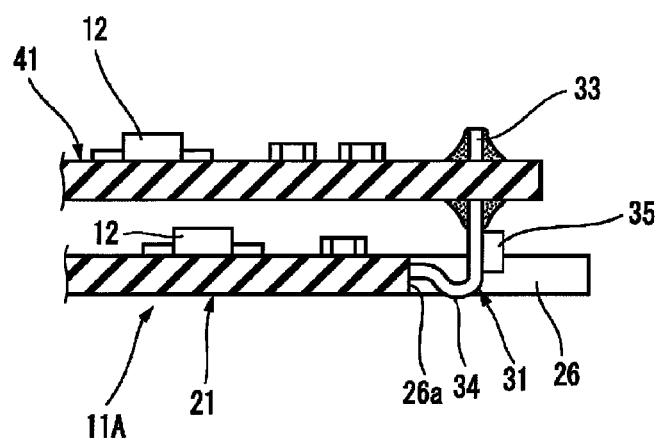
FIG. 6 is a cross-sectional view illustrating a part of the wiring substrate according to the first embodiment in which another wiring substrate is installed in parallel.

FIG. 6 is diagram illustrating a state where another wiring substrate 41 is installed in parallel and connected to the wiring substrate 11A according to the first embodiment. As shown in FIG. 6, the terminal section 33 of the connection terminal 31 of the wiring substrate 11A is connected by soldering or the like to another wiring substrate 41 which is installed in parallel at an interval to the substrate 21.

Further, with such a configuration, even though high density mounting is performed by installing another wiring substrate 41 in parallel to the wiring substrate 11A as described above, since the connection terminal 31 having a high heat radiation property is installed in parallel in the substrate 21 which is the metal core substrate having high a heat radiation property, it is possible to achieve an efficient heat radiation effect.

For example, in a case where a power wiring substrate on which a transistor or the like having a large amount of heat radiation by flow of a large amount of electric current is mounted and a control wiring substrate on which an integrated circuit which has low heat resistance is mounted are installed in parallel together, it is preferable that the wiring substrate 11A is used as the power wiring substrate and the control wiring substrate is used as another wiring substrate 41. Thus, it is possible to sufficiently radiate heat in the power wiring substrate 11A, to reliably suppress heat transfer through the connection terminal 31, and to reliably suppress heat influence on another wiring substrate 41 which is the control wiring substrate.

Further, since the connection terminal 31 is extended from the side surface portion 26a of the concave section 26 of the substrate 21 and is disposed in the concave section 26, a connection position between the connection terminal 31 and another wiring substrate 41 is set inside with reference to the side portion of the wiring substrate 11A, and thus, it is possible to install in parallel a wiring substrate 41 having the same size as the wiring substrate 11A or a wiring substrate 41 which is smaller in size than the wiring substrate 11A, as another wiring substrate 41 which is installed in parallel to the wiring substrate 11A, to thereby reduce the size.

Further, according to the wiring substrate 11A, since the connection terminal 31 bends in a direction perpendicular to the surface of the substrate 21 from the side surface portion 26a of the concave section 26 and the bending portion forms the curved section 34 which bends in the arc shape when seen from the side surface, external forces or stress applied to the connection terminal 31 can be desirably absorbed by the curved section 34. For example, even though a device which accommodates the wiring substrate 11A is mounted on a vehicle such as an automobile, vibrations generated while the vehicle is moving are smoothly absorbed by the curved section 34. Further, even though terminal deviations occur when the connection terminal 31 is connected to other components, stress occurring due to the terminal deviations is smoothly absorbed by the curved section 34.

As described above, since the curved section 34 is formed in the connection terminal 31, it is possible to prevent such a problem that excessive force is applied to a fixing portion of the connection terminal 31 to the substrate 21 or a connection location through soldering or the like of the terminal section 33 of the connection terminal 31 that causes deterioration.

Figure 7:
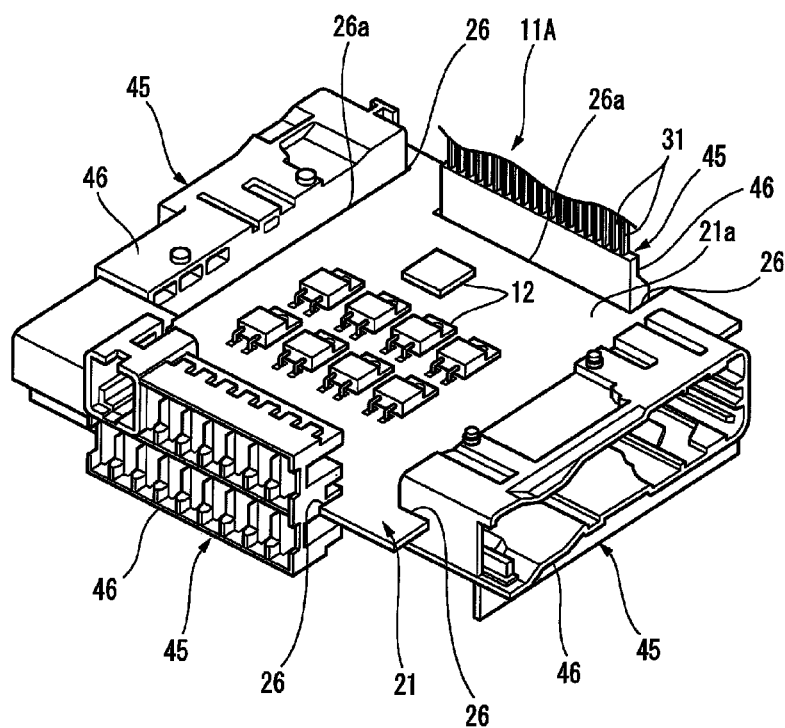
FIG. 7 is a perspective view illustrating the wiring substrate according to the first embodiment in which a connector is installed.

FIG. 7 illustrates an example in which a connector 45 is installed to the wiring substrate 11A, and the connector 45 is connected to a corresponding connector which is installed in each electronic device, power source or the like. As shown in FIG. 7, in the wiring substrate 11A, the concave section 26 is formed in four peripheral edge sides, and a housing 46 which forms the connector 45 is disposed in the concave section 26. Further, the connection terminal 31 which is extended from the side surface portion 26a of the concave section 26 is accommodated in the housing 46. In this way, according to the wiring substrate 11A in which the housing 46 of the connector 45 is installed in the concave section 26, it is possible to obtain a desirable heat radiation effect in high density mounting, and to achieve a thin product by reducing the height. For example, in a case where the housing 46 is disposed in the mounting surface 21a, the height becomes equal to or higher than the thicknesses of the substrate 21 and the housing 46, but in the wiring substrate 11A in this embodiment, it is possible to suppress the height by only the thickness of the housing 46.

Figure 8:
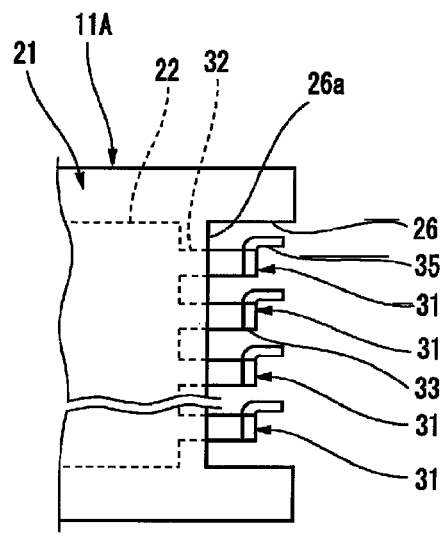
FIG. 8 is a plan view illustrating a part of a modification of the wiring substrate.

In the wiring substrate 11A, the example in which the connection terminal 31 is separated from the metal core 22 is described, but as shown in FIG. 8, the connection terminal 31 may be integrally formed with the metal core 22. In the wiring substrate 11A having the connection terminal 31 which is integrally formed with the metal core 22, the connection terminal 31 is formed in a part of the metal core 22, the connection terminal 31 is extended from the side surface portion 26a of the concave section 26 in the side direction. In the connection terminal 31 which is integrally formed with the metal core 22 as describe above, for example, it is possible to use the metal core 22 as a ground, and to easily use the connection terminal 31 as a ground terminal.

Figure 9:
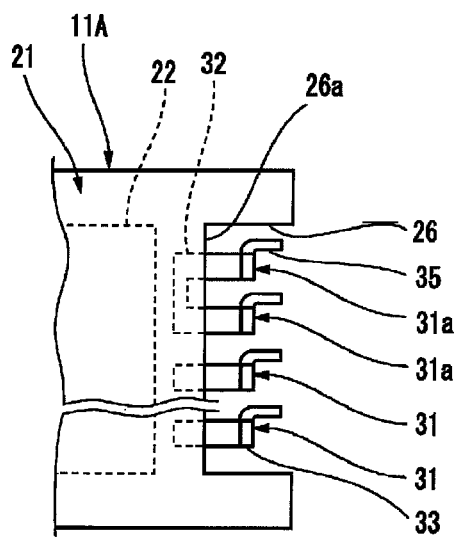
FIG. 9 is a plan view illustrating a part of a modification of the wiring substrate.

Further, as shown in FIG. 9, as the wiring substrate 11A, at least two connection terminals 31a in the plurality of connection terminals 31 may be integrally formed to be electrically connected inside the substrate 21. If at least two connection terminals 31a in the connection terminals 31 are configured to be electrically connected, it is not necessary to arrange the circuit pattern for connecting two connection terminals on the surface of the substrate, and it is possible to reduce a space of the substrate on which a variety of components are mounted, and to achieve miniaturization of the wiring substrate.

Next, in a case where the wiring substrate 11A according to the first embodiment is manufactured, a structure which includes the connection terminal 31 separated from the metal core 22 will be described as an example.

FIGS. 10A to 10F are diagrams illustrating a manufacturing process of the wiring substrate according to the invention, which are plan views and cross-sectional views of the wiring substrate which is being manufactured, respectively.

<Metal Core Working Process>

Figures 10A, 10B, 10C, 10D, 10E, 10F:
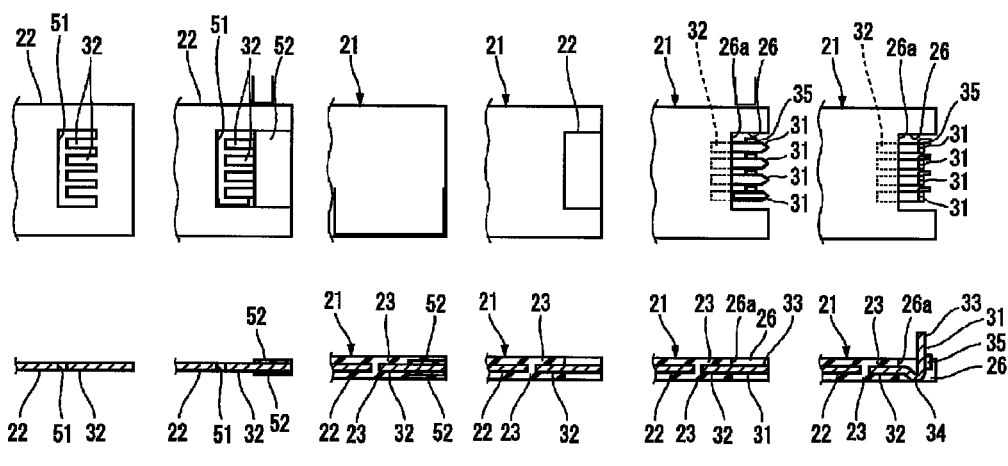
FIGS. 10A to 10F are diagrams illustrating a manufacturing process of the wiring substrate according to the invention, which are plan views and cross-sectional views of the wiring substrate which is being manufactured, respectively.

Firstly, as shown in FIG. 10A, a press working is performed to the metal core 22 of a flat panel shape, to thereby form an opening section 51 having the fixing section 32 of the connection terminal 31.

<Masking Process>

As shown in FIG. 10B, heat-resisting masking tape 52 is attached to the front and rear surfaces of the metal core 22 in a portion where the concave section 26 is to be formed.

<Substrate Forming Process>

The front and rear surfaces of the metal core 22 are surface-roughened by sandblasting, for example, and then, as shown in FIG. 10C, the insulation layers 23 are stacked on the front and rear surfaces of the metal core 22 to form the substrate 21. Thus, the opening section 51 is blocked by the insulation layers 23. At this time, the portion where the concave section 26 is to be formed is protected by the masking tape 52, and thus does not undergo the surface-roughening by the sandblasting. Further, the insulation layers 23 are not attached to the portion where the concave section 26 is to be formed.

<Metal Plate (High Thermal Conductive Layer) Exposing Process>

As shown in FIG. 10D, the insulation layers 23 in the portion where the concave section 26 is to be formed, to which the masking tape 52 is attached, are removed by a spot facing or the like, and then the metal core 22 is exposed by peeling off the masking tape 52.

<Connection Terminal Forming Process>

As shown in FIG. 10E, the concave section 26 and the terminal section 33 of the connection terminal 31 in which the concave section 26 and the heat radiation piece section 35 protrudes in the side direction thereof are formed, by processing the exposed metal core 22 by a press working, a cutting process using a router, or the like. Then, a plating process is performed in the terminal section 33 of the formed connection terminal 31.

<Connection Terminal Working Process>

Finally, as shown in FIG. 10F, the terminal section 33 of the connection terminal 31 is formed in a predetermined shape by a press working or the like. Specifically, the curved section 34 is formed by bending the terminal section 33 toward one surface side of the substrate 21 and by curving a portion which is a location of the bending portion, and the heat radiation piece section 35 is bent.

According to the above-described process, high density mounting including the connection terminal 31 having the heat radiation piece section 35 can be achieved in the substrate 21 which is the metal core substrate, it is possible to easily manufacture the wiring substrate 11A of a high heat radiation property. Further, since the connection terminal 31 is formed so that which the heat radiation piece section 35 protrudes in the side direction thereof, it is possible to form the heat radiation piece section 35 in a peripheral blank portion of the connection terminal 31 which is discarded when the connection terminal 31 is formed. Thus, it is possible to effectively use the metal core 22 when the connection terminal 31 is formed, and to enhance the heat radiation effect at low cost by reducing unnecessary waste.

In a case where the wiring substrate 11A (refer to FIG. 8) in which the connection terminal 31 is integrally formed with the metal core 22 is manufactured, the metal core working process is omitted.

Second Embodiment

A wiring substrate according to a second embodiment will be described.

The same reference numerals are given to the same elements as the wiring substrate 11A according to the first embodiment, and detailed description thereof will be omitted.

Figure 11:
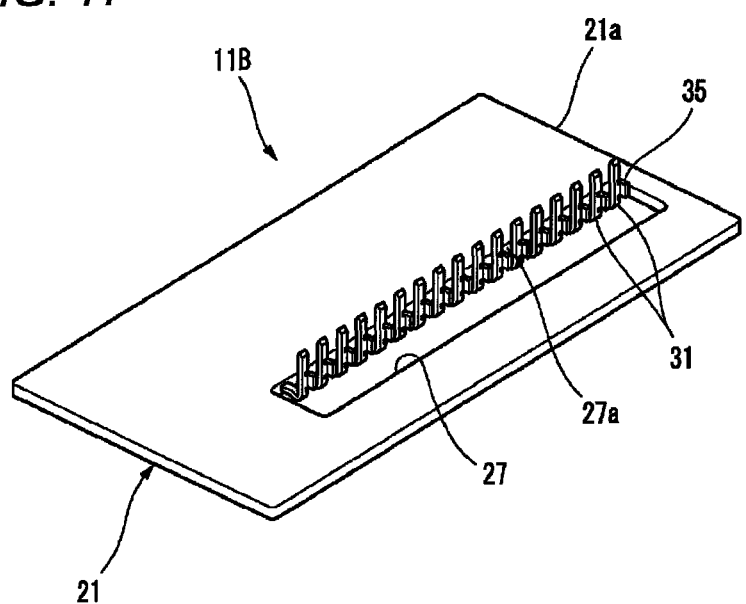
FIG. 11 is a perspective view illustrating a wiring substrate according to a second embodiment of the invention.
Figure 12:
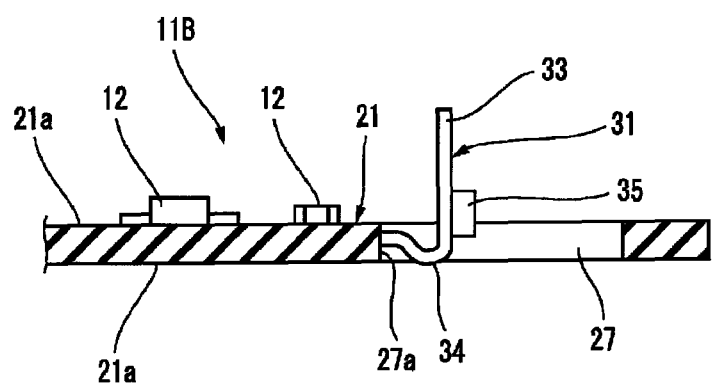
FIG. 12 is a cross-sectional view illustrating a part of the wiring substrate according to the second embodiment of the invention.
Figure 13:
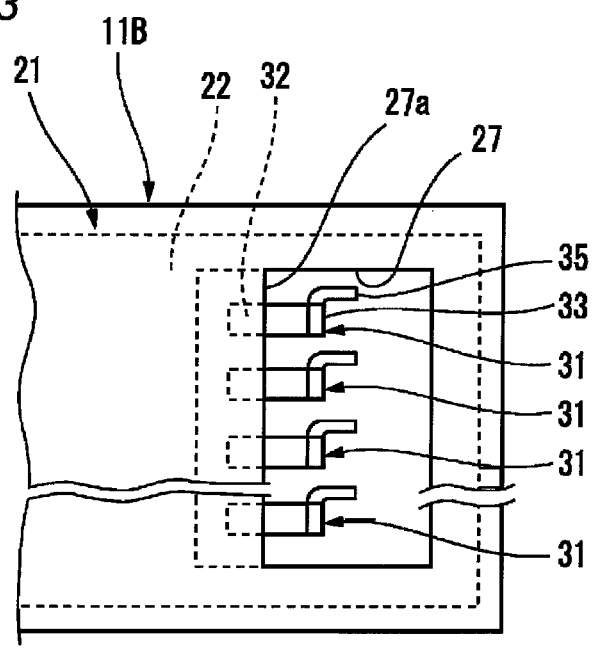
FIG. 13 is a plan view illustrating a part of the wiring substrate.

FIG. 11 is a perspective view illustrating the wiring substrate according to the second embodiment of the invention, FIG. 12 is a cross-sectional view illustrating a part of the wiring substrate according to the second embodiment of the invention, and FIG. 13 is a plan view illustrating a part of the wiring substrate.

As shown in FIGS. 11 to 13, a wiring substrate 11B according to the second embodiment includes a high heat radiation substrate 21 in which insulation layers 23 are formed on front and rear surfaces of the metal core 22 and a plurality of connection terminals 31 which are disposed on the high heat radiation substrate 21.

In the substrate 21, a window section 27 is formed in a part of the metal core 22, and the plurality of connection terminals 31 are extended in an aligned state from one inside surface portion in which the window section 27 is formed, that is, an inside surface portion 27a in the longitudinal direction. Since the connection terminal 31 is formed of the same conductive metal material as the metal core 22, such as copper or copper alloy, the connection terminal 31 is disposed and fixed between the insulation layers 23, and is formed as the same layer as the metal core 22.

The connection terminal 31 includes a fixing section 32 fixed in the substrate 21, and a terminal section 33 extended from the inside surface portion 27a in the window section 27, and the terminal section 33 bends upward to be perpendicular to the surface of the substrate 21. Further, the bending portion of the terminal section 33 of the connection terminal 31 is configured as a curved section 34 which is formed in an arc shape when seen from a side surface. Further, since the heat radiation piece section 35 is formed to be extended from one side section in the side direction, its surface area is enlarged.

In the wiring substrate 11B having such a configuration, for example, the connection terminal 31 is connected to another wiring substrate, or a component such as a connector is installed in the connection terminal 31.

Even in the case of the wiring substrate 11B, since the connection terminal 31 in which the heat radiation piece section 35 is integrally formed and its surface area is enlarged is disposed in the substrate 21 including the metal core substrate in which the insulation layers 23 are installed on the front and rear surfaces of the metal core 22 which is the high thermal conductive layer, it is possible to achieve a heat radiation effect of the substrate 21 itself and a heat radiation effect through the connection terminal 31. That is, even in a case where the substrate 21 which is the metal core substrate and the connection terminal 31 are distant from each other, the heat radiation effect of the connection terminal 31 can be obtained by the heat radiation piece section 35. Thus, for example, even though high density mounting is attempted by connecting a variety of heat generating components or another substrate to the connection terminal 31, it is possible to achieve a sufficient heat radiation effect.

That is, it is possible to achieve high density mounting while remarkably enhancing the heat radiation effect.

Particularly, since the window section 27 is formed in the substrate 21 to enhance a ventilation characteristic, it is possible to obtain a heat radiation effect through the window section 27, in addition to a heat radiation effect through the substrate 21 itself and a heat radiation effect through the heat radiation piece section 35 of the connection terminal 31.

Figure 14:
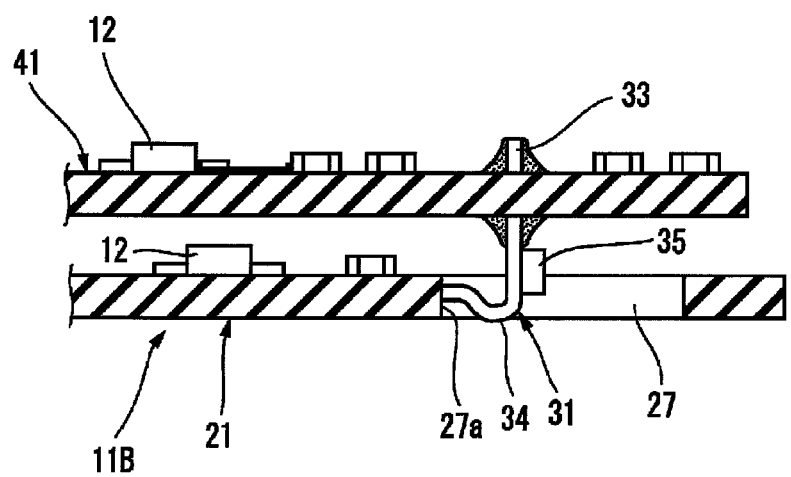
FIG. 14 is a perspective view illustrating a part of the wiring substrate according to the second embodiment in which another wiring substrate is installed.

Here, FIG. 14 illustrates an example in which another wiring substrate 41 is installed in parallel with the wiring substrate 11B according to the second embodiment. As shown in FIG. 14, the terminal section 33 of the connection terminal 31 of the wiring substrate 11B is connected by soldering or the like to another wiring substrate 41 which is installed in parallel at an interval to the substrate 21.

Further, with such a configuration, even though high density mounting is performed by installing another wiring substrate 41 to the wiring substrate 11B as described above, since the connection terminal 31 having a high heat radiation property is installed in the substrate 21 which is the metal core substrate having high heat radiation property to reliably enhance the heat radiation effect, it is possible to achieve a sufficient heat radiation effect.

Further, since the connection terminal 31 is extended from the inside surface portion 27a which forms the window section 27 of the substrate 21 and is disposed in the window section 27, a connection position between the connection terminal 31 and another wiring substrate 41 can be set inside with reference to the side portion of the wiring substrate 11B, and thus, it is possible to install parallel a wiring substrate 41 having the same size as the wiring substrate 11B or a wiring substrate 41 which is smaller in size than the wiring substrate 11B, as another wiring substrate 41 which is installed in parallel to the wiring substrate 11B, to thereby reduce the size.

Further, even in the case of the wiring substrate 11B, since the connection terminal 31 bends in a direction perpendicular to the surface of the substrate 21 from the inside surface portion 27a and the bending portion forms the curved section 34 which bends in the arc shape when seen from the side surface, external forces or stress applied to the connection terminal 31 can be desirably absorbed by the curved section 34. For example, even when a device which accommodates the wiring substrate 11B is mounted on a vehicle such as an automobile, vibrations generated while the vehicle is moving are smoothly absorbed by the curved section 34. Further, even though terminal deviations occur when the connection terminal 31 is connected to other components, stress occurring due to the terminal deviations is smoothly absorbed by the curved section 34.

Further, as the curved section 34 is formed in the connection terminal 31, it is possible to prevent such a problem that excessive force is applied to the fixing portion of the connection terminal 31 to the substrate 21 or the connection locations through soldering or the like of the terminal section 33 of the connection terminal 31 that causes deterioration.

Figure 15:
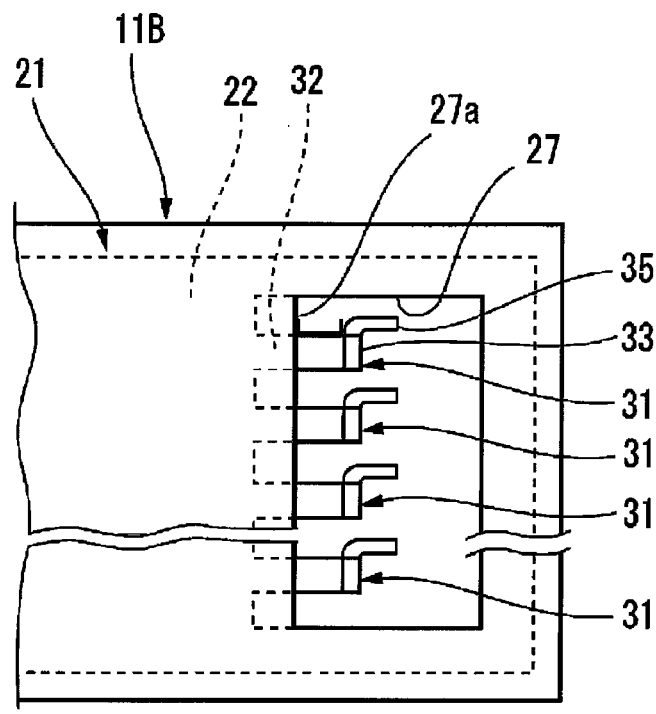
FIG. 15 is a plan view illustrating a part of a modification of the wiring substrate.

In the wiring substrate 11B, the example in which the connection terminal 31 is separated from the metal core 22 is described, but as shown in FIG. 15, the connection terminal 31 may be integrally formed with the metal core 22. In the wiring substrate 11B having the connection terminal 31 which is integrally formed with the metal core 22, the connection terminal 31 is formed in a part of the metal core 22, the connection terminal 31 is extended from the inside surface portion 27a of the window section 27 in the side direction. As described above, as the metal core 22 is integrally formed with the connection terminal 31, its heat radiation effect is enhanced. Further, in the connection terminal 31 which is integrally formed with the metal core 22 as describe above, for example, it is possible to use the metal core 22 as a ground, and to easily use the connection terminal 31 as a ground terminal.

Figure 16:
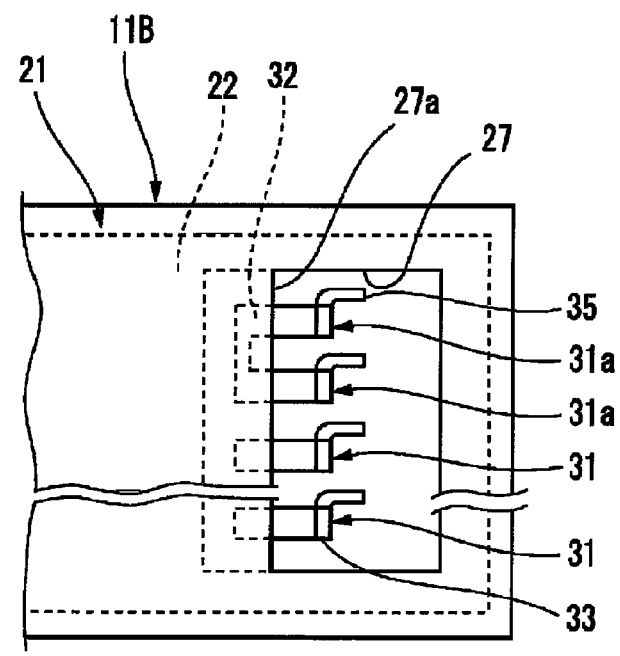
FIG. 16 is a plan view illustrating a part of another modification of the wiring substrate.

Further, as shown in FIG. 16, as the wiring substrate 11B, at least two connection terminals 31a in the plurality of connection terminals 31 may be integrally formed to be electrically connected inside the substrate 21. If at least two connection terminals 31a in the connection terminals 31 are configured to be electrically connected, it is not necessary to arrange the circuit pattern for connecting two connection terminals on the surface of the substrate, and it is possible to reduce a space of the substrate on which a variety of components are mounted, and to achieve miniaturization of the wiring substrate.

Third Embodiment

Figure 17:
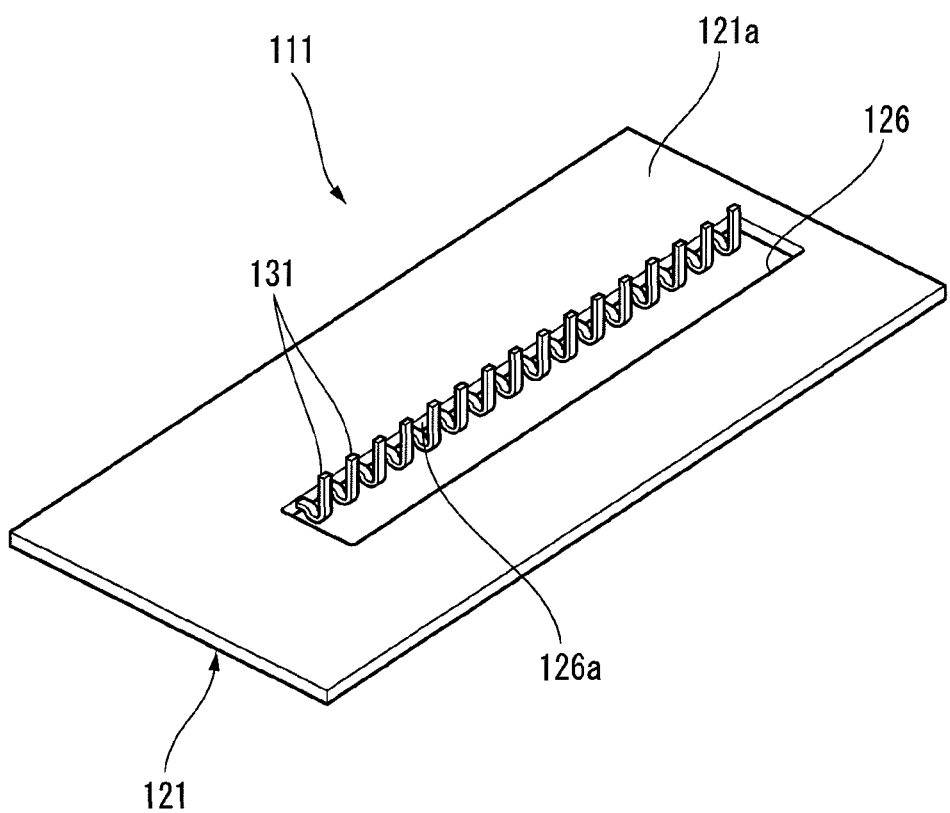
FIG. 17 is a perspective view of a first wiring substrate according to a third embodiment of the invention.
Figure 18:
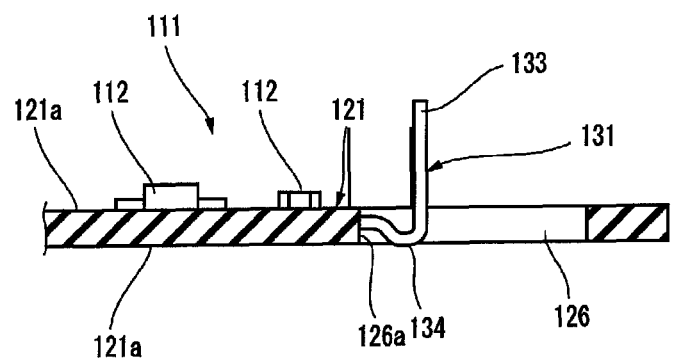
FIG. 18 is a cross-sectional view illustrating a part of the first wiring substrate according to the third embodiment of the invention.
Figure 19:
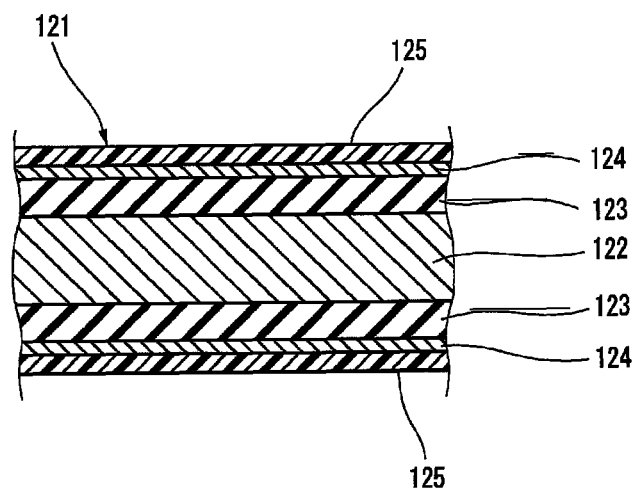
FIG. 19 is a cross-sectional view illustrating a structure of the first wiring substrate.
Figure 20:
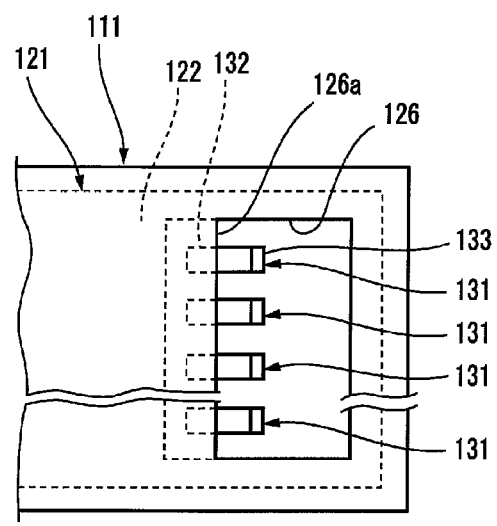
FIG. 20 is a plan view illustrating a part of the first wiring substrate.

FIG. 17 is a perspective view illustrating a wiring substrate according to the third embodiment of the invention, FIG. 18 is a cross-sectional view illustrating a part of the wiring substrate according to the embodiment of the invention, FIG. 19 is a cross-sectional view illustrating a structure of a substrate which forms the wiring substrate, and FIG. 20 is a plan view illustrating a part of the wiring substrate.

As shown in FIGS. 17 and 18, a wiring substrate 111 in this embodiment includes a high heat radiation substrate (hereinafter, referred to as a "substrate") 121 and a plurality of connection terminals 131 which are disposed on the high heat radiation substrate 121.

As shown in FIG. 19, the substrate 121 includes a plate-shaped metal core (high thermal conductive layer) 122 which is formed of copper, copper alloy or the like in the center in a thickness direction, and insulation layers 123 which are formed by synthetic resin having thermosetting and insulating properties on front and rear surfaces of the metal core 122. Further, a circuit pattern 124 is formed on a surface of the insulation layer 123, and a surface of the circuit pattern 124 is covered by a resist layer 125. That is, the substrate 121 is a metal core substrate (high heat radiation substrate) having high heat radiation and heat distributing properties by installation of the metal core 122, its front and rear surfaces are formed as mounting surfaces 121a having the circuit patterns 124, as shown in FIG. 18. A variety of electric and electronic components 112 are mounted on the mounting surface 121a. Heat of the electric and electronic components 112 generated in the substrate 121 which is the metal core substrate is smoothly distributed by the metal core 122 and is radiated outside.

As shown in FIGS. 17 and 20, in the wiring substrate 111 according to this invention, a window section 126 is formed in the substrate 121, and the window section 126 is formed in a portion of the metal core 122. A plurality of connection terminals 131 are extended in an aligned state from one inside surface portion which forms the window section 126, that is, an inside surface portion 126a in a longitudinal direction. The connection terminals 131 are electrically connected with the circuit patterns 124 by through-holes (not shown) formed in the substrate 121, for example.

Since the connection terminal 131 is made of the same conductive metallic material as the metal core 122, such as copper or copper alloy, the connection terminal 131 is disposed and fixed between the insulation layers 123, and is formed in the same layer as the metal core 122.

As shown in FIGS. 18 and 20, the connection terminal 131 includes a fixing section 132 which is fixed to the substrate 121 and a terminal section 133 which is extended from the inside surface portion 126a of the window section 126. The terminal section 133 bends upward to be perpendicular to the surface of the substrate 121, and the bending portion of the terminal section 133 of the connection terminal 131 is formed as a curved section 134 which is formed in an arc shape when seen from a side surface.

In the wiring substrate 111 having such a configuration, for example, the connection terminal 131 is connected to another wiring substrate, or a component such as a connector is installed to the connection terminal 131.

According to the wiring substrate 111, since the window section 126 is formed in the high heat radiation substrate 121 including the metal core substrate in which the insulation layers 123 are installed on the front and rear of the metal core 122 which is the high thermal conductive layer and its air permeability is enhanced, it is possible to achieve a heat radiation effect of the substrate 121 itself and a heat radiation effect through the window section 126. Thus, for example, even though high density mounting is attempted by connecting a variety of heat generating components or another substrate to the connection terminal 131 which is extended from the inside surface portion 126a of the window section 126, it is possible to achieve a sufficient heat radiation effect. That is, it is possible to achieve high density mounting while remarkably enhancing the heat radiation effect.

Figure 21:
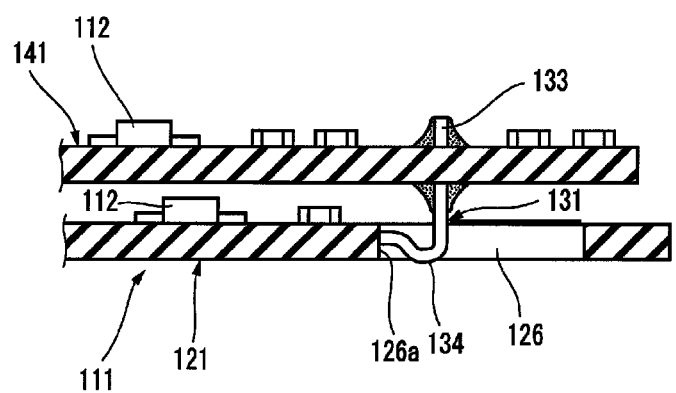
FIG. 21 is a cross-sectional view illustrating a part of the first wiring substrate according to the third embodiment in which a second wiring substrate is installed in parallel.

FIG. 21 is a diagram illustrating a state where another wiring substrate 141 is installed in parallel and connected to the wiring substrate 111 according to the invention. As shown in FIG. 21, the terminal section 133 of the connection terminal 131 of the wiring substrate 111 is connected by soldering or the like to another wiring substrate 141 which is installed in parallel at an interval to the substrate 121.

Further, with such a configuration, even though high density mounting is performed by installing another wiring substrate 141 in parallel to the wiring substrate 111 as described above, since the window section 126 is installed in the substrate 121 which is the metal core substrate having a high heat radiation property to remarkably enhance a heat radiation effect, it is possible to achieve a sufficient heat radiation effect.

Further, since the connection terminal 131 is extended from the inside surface portion 126a which forms the window section 126 of the substrate 121 and is disposed in the window section 126, a connection position between the connection terminal 131 and another wiring substrate 141 is can set inside with reference to the side portion of the wiring substrate 111, and thus, it is possible to install in parallel a wiring substrate 141 having the same size as the wiring substrate 111 or a wiring substrate 141 which is smaller in size than the wiring substrate 111, as another wiring substrate 141 which is installed in parallel to the wiring substrate 111 of the present invention, to thereby reduce the size.

Further, according to the wiring substrate 111 of the invention, since the connection terminal 131 bends in a direction perpendicular to the surface of the substrate 121 from the inside surface portion 126a and the bending portion forms the curved section 134 which bends in the arc shape when seen from the side surface, external forces or stress applied to the connection terminal 131 can be desirably absorbed by the curved section 134. For example, even though a device which accommodates the wiring substrate 111 may be mounted on a vehicle such as an automobile, vibrations generated while the vehicle is moving are smoothly absorbed by the curved section 134. Further, even though terminal deviations occur when the connection terminal 131 is connected to other components, stress occurring due to the terminal deviations is smoothly absorbed by the curved section 134.

Further, since the curved section 134 is formed in the connection terminal 131, it is possible to prevent a problem such that excessive force is applied to a fixing portion of the connection terminal 131 to the substrate 121 or a connection location through soldering or the like of the terminal section 133 of the connection terminal 131 that causes deterioration.

Figure 22:
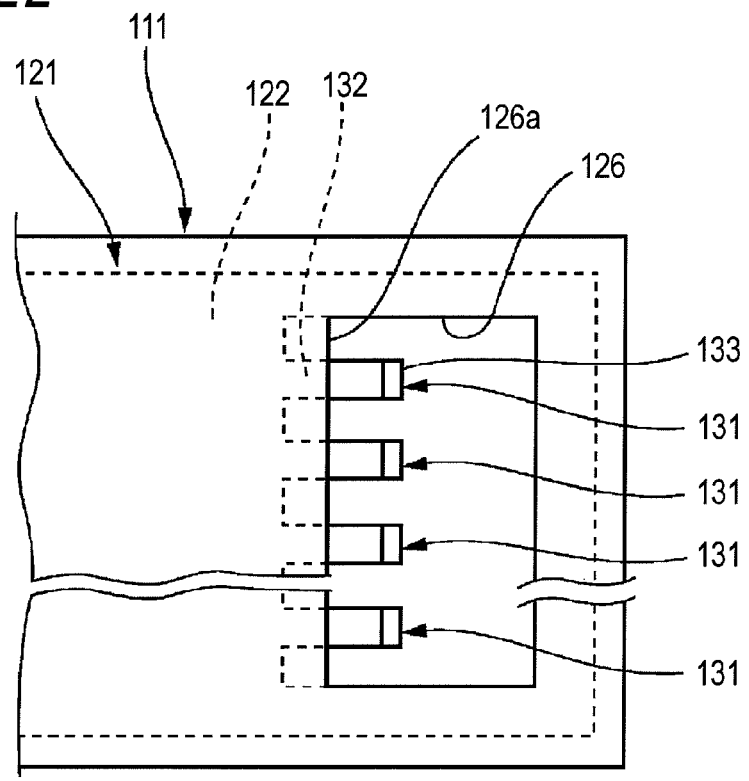
FIG. 22 is a plan view illustrating a part of a modification of the first wiring substrate.

In the wiring substrate 111, the example in which the connection terminal 131 is separated from the metal core 122 is described, but as shown in FIG. 22, the connection terminal 131 may be integrally formed with the metal core 122. In the wiring substrate 111 having the connection terminal 131 which is integrally formed with the metal core 122, the connection terminal 131 is formed in a part of the metal core 122, the connection terminal 131 is extended from the inside surface portion 126a of the window section 126 in the side direction. In this way, as the metal core 122 is integrally formed with the connection terminal 131, the heat radiation effect is enhanced. Further, in the connection terminal 131 which is integrally formed with the metal core 122 as describe above, for example, it is possible to use the metal core 122 as a ground, and to easily use the connection terminal 131 as a ground terminal.

Figure 23:
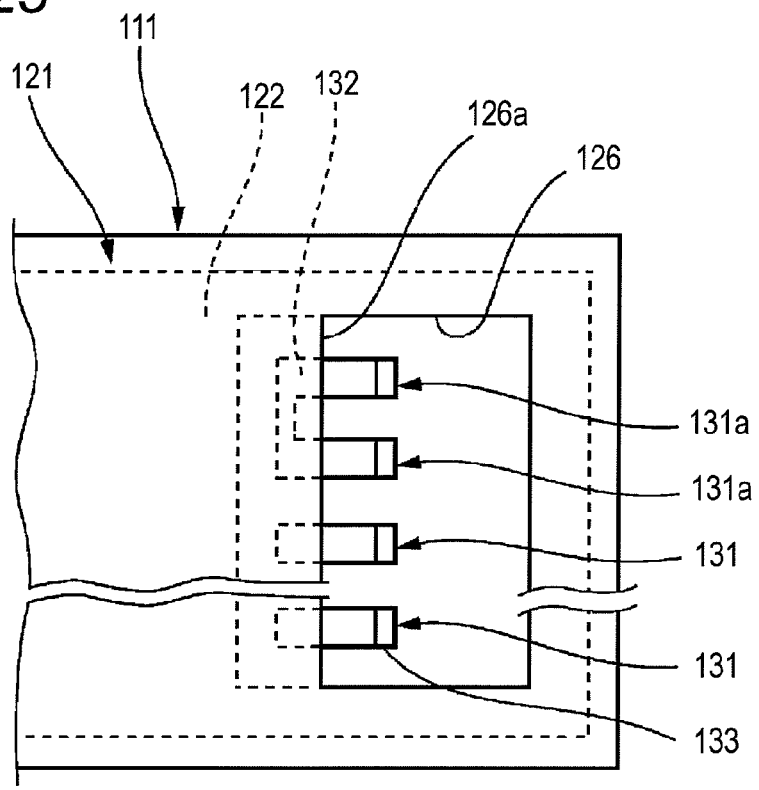
FIG. 23 is a plan view illustrating a part of a modification of the first wiring substrate.

Further, as shown in FIG. 23, as the wiring substrate 111, at least two connection terminals 131a in the plurality of connection terminals 131 may be integrally formed to be electrically connected inside the substrate 121. If at least two connection terminals 131a in the connection terminals 131 are configured to be electrically connected, it is not necessary to arrange the circuit pattern for connecting two connection terminals on the surface of the substrate, and it is possible to reduce a space of the substrate on which a variety of components are mounted, and to achieve miniaturization of the wiring substrate.

Fourth Embodiment

A wiring substrate according to the fourth embodiment will be described.

The same reference numerals are given to the same elements as the wiring substrate 111A according to the third embodiment, and detailed description thereof will be omitted.

Figure 24:
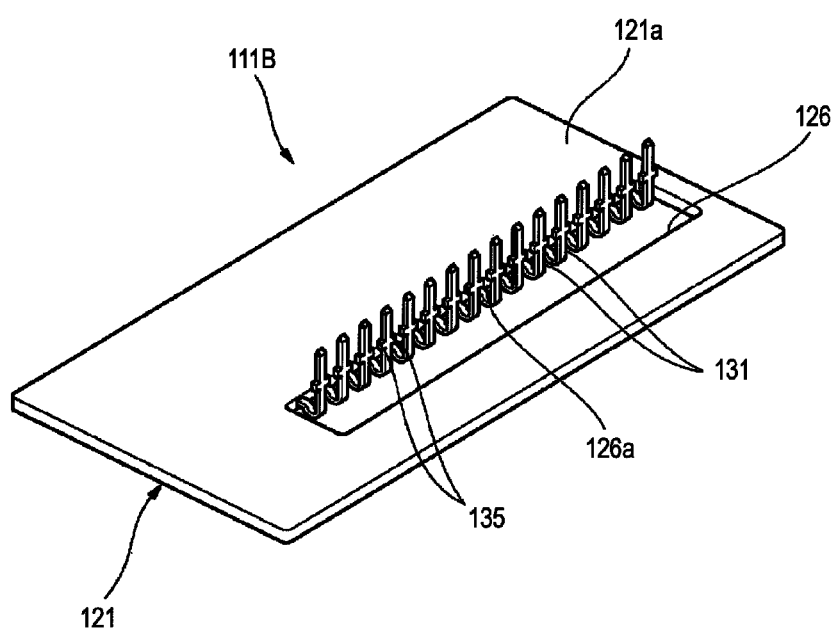
FIG. 24 is a perspective view illustrating a part of the first wiring substrate according to a fourth embodiment of this invention.
Figure 25:
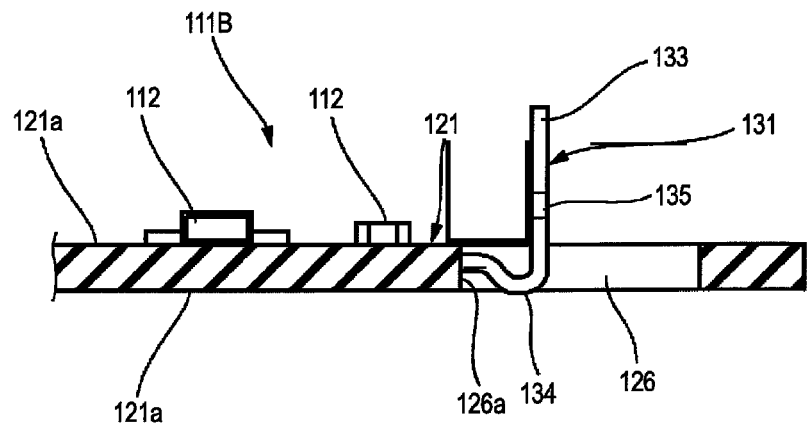
FIG. 25 is a cross-sectional view illustrating a part of the first wiring substrate according to the fourth embodiment of the invention.
Figure 26:
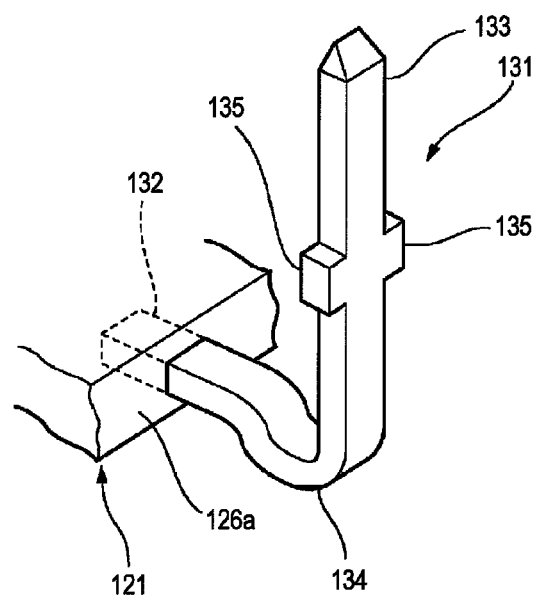
FIG. 26 is a perspective view illustrating a connection terminal of the first wiring substrate.
Figure 27A:
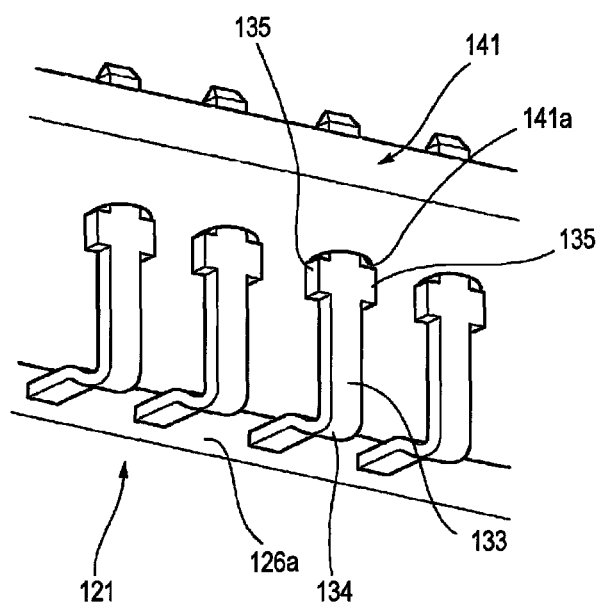
FIGS. 27A to 27B are diagrams illustrating a state where a second wiring substrate is installed in parallel with the first wiring substrate, of which A is a perspective view when seen from a lower side in a support location of the second wiring substrate and of which B is a side view thereof.
Figure 27B:
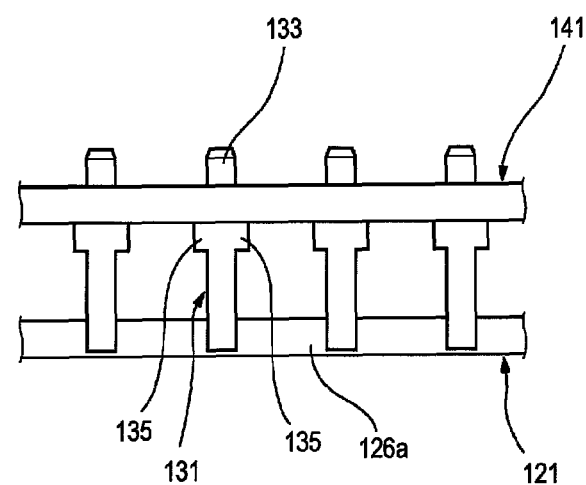
Figure 28:
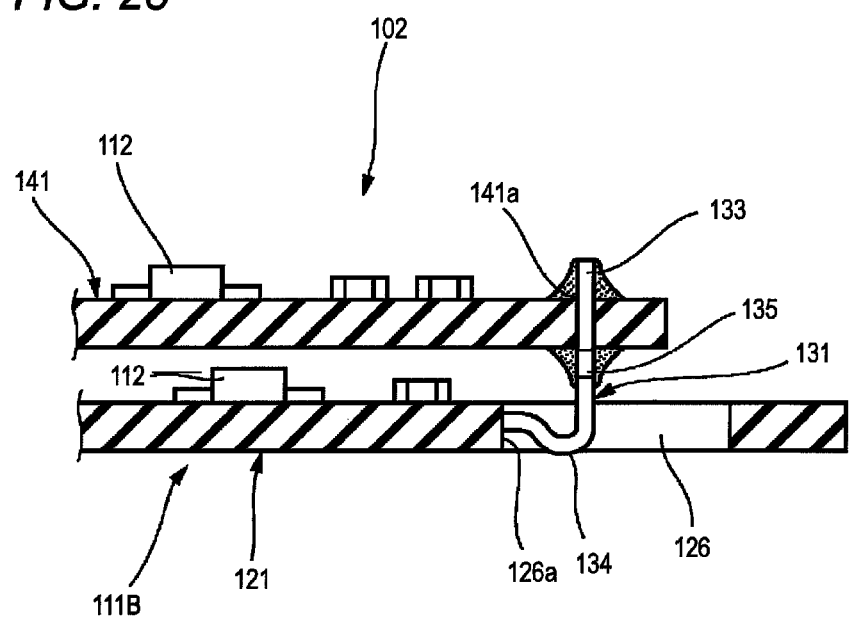
FIG. 28 is a perspective view illustrating a part of the laminated wiring substrate according to the fourth embodiment in which the first wiring substrate and the second wiring substrate are installed in parallel.

FIG. 24 is a perspective view illustrating the wiring substrate according to the fourth embodiment of the invention, FIG. 25 is a cross-sectional view illustrating a part of the wiring substrate according to the fourth embodiment of the invention, FIG. 26 is a perspective view illustrating a connection terminal of the first wiring substrate. FIGS. 27A and 27B are diagrams illustrating a state where a second wiring substrate is installed in parallel with the wiring substrate according to the modification of the invention, in which FIG. 27A is a perspective view when seen from a lower side in a support location of wiring substrate and FIG. 27B is a side view thereof, and FIG. 28 is a cross-sectional view illustrating a part of the laminated wiring substrate according to the modification of the embodiment in which the first wiring substrate and the second wiring substrate are installed in parallel.

As shown in FIGS. 24 and 25, a wiring substrate 111B in the fourth embodiment includes a high heat radiation substrate 121 having insulation layers 123 which are formed on front and rear surfaces of the metal core 122 and a plurality of connection terminals 131 which are disposed on the high heat radiation substrate 121.

In the fourth embodiment, as shown in FIG. 26, a support piece 135 is integrally installed to the terminal section 133 of the connection terminal 131 that is provided on the first wiring substrate 111B. Since the support piece 135 is formed by a press working, the support piece 135 is extended from both sides of the terminal section 133 in a side direction.

The support piece 135 is positioned so that an upper position thereof is positioned at a lower surface of second wiring substrate 141 when the second wiring substrate 141 is installed in parallel to the first wiring substrate 111B. Further, as shown in FIG. 27A, the width of the both sides of the support piece 135 is designed so as to be larger than the diameter of a through-hole 141a of the wiring substrate 141 into which the terminal section 133 is inserted.

Accordingly, if the terminal section 133 of the connection terminal 131 is inserted into the through-hole 141a of the second wiring substrate 141, as shown in FIGS. 27A and 27B, the second wiring substrate 141 is locked to the support piece 135, and the movement toward a base side of the terminal section 133 with reference to the locking position is controlled. Thus, the second wiring substrate 141 is positioned in a position at a predetermined interval with respect to the substrate 121 of the wiring substrate 111.

Here, in a case where the second wiring substrate 141 is installed in parallel to the first wiring substrate 111, it is necessary to connect the second wiring substrate 141 to the terminal section 133 by soldering in a state where the second wiring substrate 141 is positioned at the predetermined interval with respect to the substrate 121. In this respect, in the wiring substrate 111 including the connection terminal 131 which does not have the support pieces 135, the second wiring substrate 141 should be held in a predetermined position with respect to the substrate 121 using a component such as a spacer or a jig, in the connection process between the terminal section 133 and the wiring substrate 141 through soldering.

In contrast, as described above, according to the first wiring substrate 111B including the connection terminal 131 having the support pieces 135, it is possible to support the second wiring substrate 141 in a state where the second wiring substrate 141 is locked to the support pieces 135 and is positioned at the predetermined interval with respect to the substrate 121 of the first wiring substrate 111B, without using a component such as a spacer or a jig. Thus, as shown in FIG. 28, in a laminated wiring substrate 102 in which the second wiring substrate 141 is installed in parallel to the first wiring substrate 111B, it is possible to easily dispose the second wiring substrate 141 in a position at the predetermined interval with respect to the first wiring substrate 111 for connection with the connection terminal 131 through soldering. Accordingly, it is possible to reduce time for the connection work of the second wiring substrate 141 to thereby reduce the manufacturing cost.

Further, as the support piece 135 is formed in the connection terminal 131, a surface area of a portion where the connection terminal 131 is exposed outside is enlarged, and thus, it is possible to enhance a heat radiation property.

Fifth Embodiment

Next, a wiring substrate according to a fifth embodiment will be described.

Figure 29:
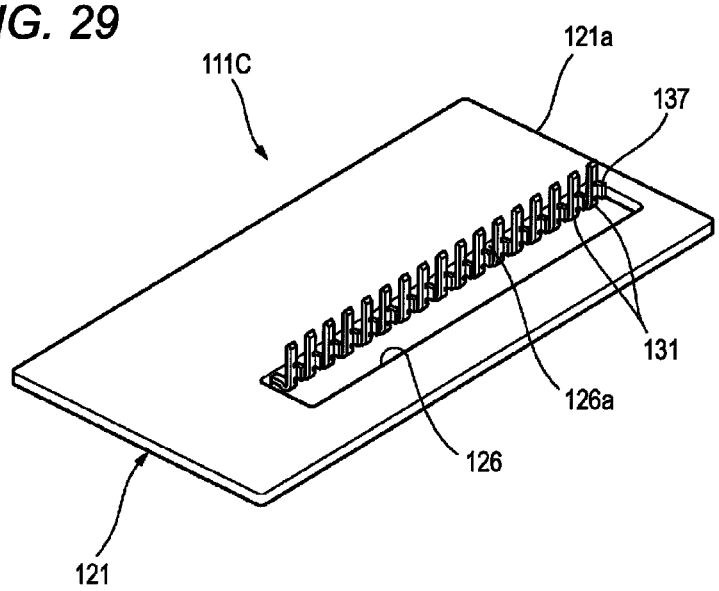
FIG. 29 is a perspective view illustrating a part of the first wiring substrate according to a fifth embodiment of this invention.
Figure 30:
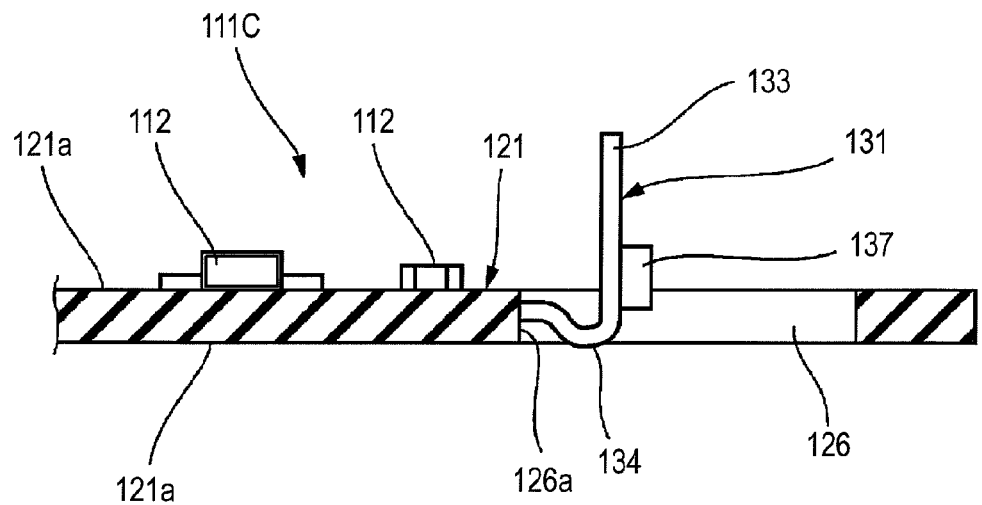
FIG. 30 is a cross-sectional view illustrating a part of the first wiring substrate according to the fifth embodiment of the invention.
Figure 31:
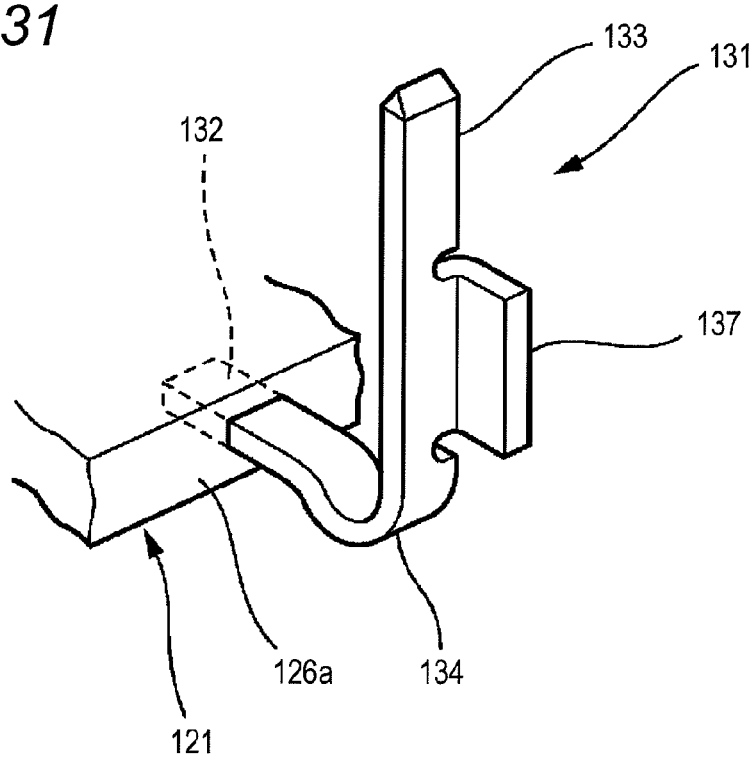
FIG. 31 is a perspective view illustrating a connection terminal of the first wiring substrate.

FIG. 29 is a perspective view illustrating the first wiring substrate according to the fifth embodiment of the invention, FIG. 30 is a cross-sectional view illustrating a part of the first wiring substrate according to the fifth embodiment of the invention, and FIG. 31 is a plan view illustrating a part of the first wiring substrate.

As shown in FIGS. 29 and 30, a wiring substrate 111C in the fifth embodiment includes a high heat radiation substrate 121 having insulation layers 123 which are formed on front and rear surfaces of the metal core 122 and a plurality of connection terminals 131 which are disposed on the high heat radiation substrate 121.

In the fifth embodiment, as shown in FIG. 31, a head radiation piece section 137 is integrally installed to the terminal section 133 of the connection terminal 131 that is provided on the first wiring substrate 111C. Since the heat radiation piece section 137 is formed by a press working, the heat radiation piece section 137 is extended from one side of the terminal section 133 in a side direction.

Accordingly, it is possible to achieve a heat radiation effect of the substrate 121 itself and a heat radiation effect through the connection terminal 131. That is, even in a case where the substrate 121 which is the metal core substrate and the connection terminal 131 are distant from each other, the heat radiation effect of the connection terminal 131 can be obtained by the heat radiation piece section 137. Particularly, since the window section 126 is formed in the substrate 121 to enhance a ventilation characteristic, it is possible to obtain a heat radiation effect through the window section 126, in addition to a heat radiation through the substrate 121 itself and a heat radiation effect through the heat radiation piece section 137 of the connection terminal 131.

Figure 32:
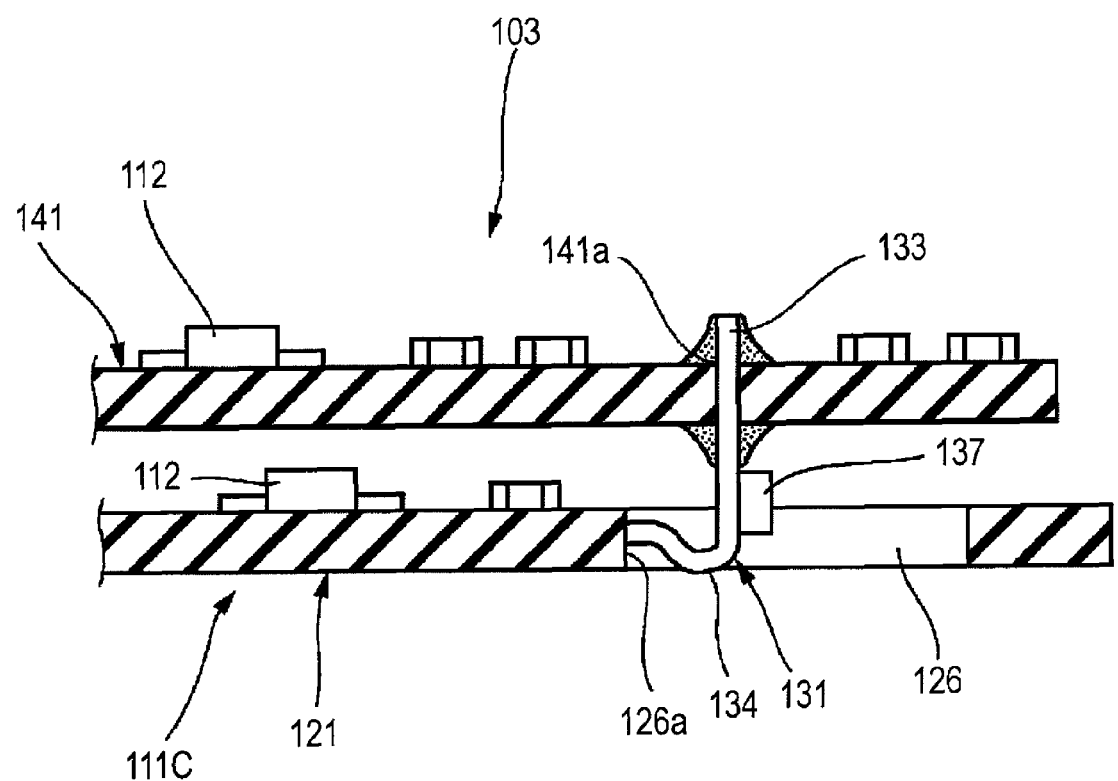
FIG. 32 is a perspective view illustrating a part of the laminated wiring substrate according to the fifth embodiment in which the first wiring substrate and the second wiring substrate are installed in parallel.

As shown in FIG. 32, in the laminated wiring substrate 103 in which the first wiring substrate 111C is provided in parallel to the second wiring substrate 141, the first wiring substrate 111C is constructed such that the connection terminal 131 is provided with the substrate 121 having the metal core substrate having high radiation property. Since the radiation effect is highly improved, it is possible to obtain the enough radiation effect.

Next, the manufacturing method of the laminated wiring substrate 101, 102, 103 will be described by taking the third embodiment as an example. In addition, the first wiring substrate 111A will be explained by taking, a structure which includes the connection terminal 131 separated from the metal core 122 will be described as an example.

FIGS. 33A to 33F are diagrams illustrating a manufacturing process of the wiring substrate, which are plan views and cross-sectional views of the wiring substrate which is being manufactured, respectively.

<Metal Core Working Process>

Figures 33A, 33B, 33C, 33D, 33E, 33F:
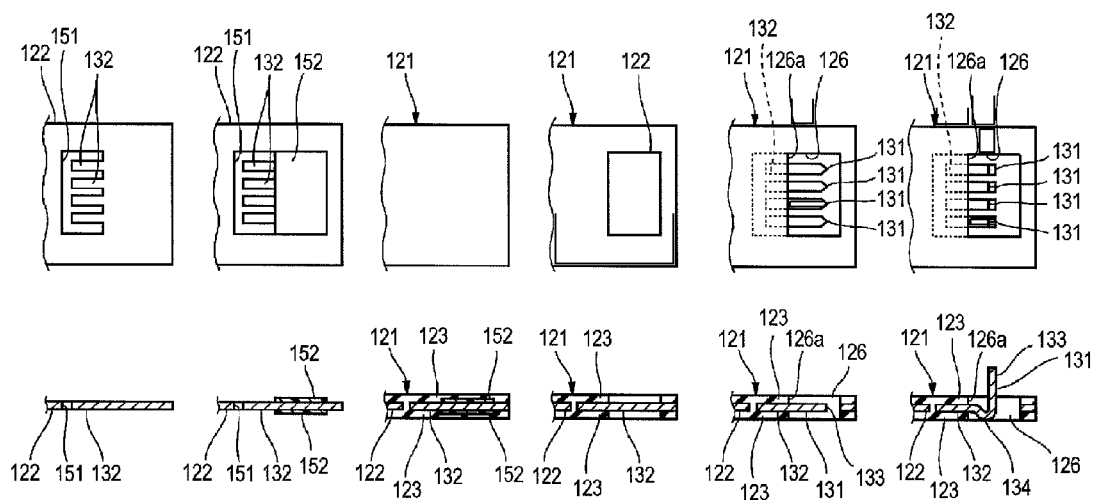
FIGS. 33A to 33F are diagrams illustrating a manufacturing process of the wiring substrate according to the invention, which are plan views and cross-sectional views of the wiring substrate which is being manufactured, respectively.

Firstly, as shown in FIG. 33A, a press working is performed to the metal core 122 of a flat panel shape, to thereby form an opening section 151 having the fixing section 132 of the connection terminal 131.

<Masking Process>

As shown in FIG. 33B, heat-resisting masking tape 152 is attached to the front and rear surfaces of the metal core 122 in a portion where the window section 126 is to be formed.

<Substrate Forming Process>

The front and rear surfaces of the metal core 122 are surface-roughened by sandblasting, for example, and then, as shown in FIG. 33C, the insulation layers 123 are stacked on the front and rear surfaces of the metal core 122 to form the high heat radiation substrate 121. Thus, the opening section 151 is blocked by the insulation layers 123. At this time, the portion where the window section 126 is to be formed is protected by the masking tape 152, and thus does not undergo the surface-roughening by the sandblasting.

Further, the insulation layers 123 are not attached to the portion where the window section 126 is to be formed.

<Metal Plate (High Thermal Conductive Layer) Exposing Process>

As shown in FIG. 33D, the insulation layers 123 in the portion where the window section 126 is to be formed, to which the masking tape 152 is attached, are removed by a spot facing or the like, and then the metal core 122 is exposed by peeling off the masking tape 152.

<Connection Terminal Forming Process>

As shown in FIG. 33E, the window section 126 and the terminal section 133 of the connection terminal 131 are formed by processing the exposed metal core 122 by a press working, a cutting work using a router, or the like. Then, a plating process is performed in the terminal section 133 of the formed connection terminal 131.

<Connection Terminal Working Process>

Finally, as shown in FIG. 33F, the terminal section 133 of the connection terminal 131 is formed in a predetermined shape by a press working or the like. Specifically, the curved section 134 is formed by bending the terminal section 133 toward one surface side of the substrate 121 and by curving a portion which is a location of the bending portion.

According to the above-described process, it is possible to easily manufacture the first wiring substrate which can be mounted at high density and has a high heat radiation property, in which the window section 126 is formed in the high heat radiation substrate 121 which is the metal core substrate and the connection terminal 131 is extended from the inside surface portion 126a of the window section 126.

In a case where the first wiring substrate (refer to FIG. 33) in which the connection terminal 131 is integrally formed with the metal core 122 is manufactured, the metal core working process is omitted.

<Connection Process>

Next, the manufactured respective first wiring substrate 111A, 111B, 111C and the second wiring substrate is connected.

In order to connect the first wiring substrate 111A, 111B, 111C with the second wiring substrate 141, the terminal section 133 of the connection terminal 131 of the first wiring substrate 111A, 111B, 111C is respectively inserted to the insertion holes 141a of the second wiring substrate 141. Herein, in order to obtain a predetermined distance between the first wiring substrate 111A, 111B, 111C and the second wiring substrate 141, it is preferable to use a jig such as a spacer. In addition, in a case that the supporting piece 135 is provided to the terminal section 133 as the second embodiment, it is possible to position without using the spacer.

And, the laminated wiring substrate of this invention is manufactured by connecting the first wiring substrate 111A, 111B, 111C to the second wiring substrate 141 by soldering or the like.

Sixth Embodiment

Figure 34:
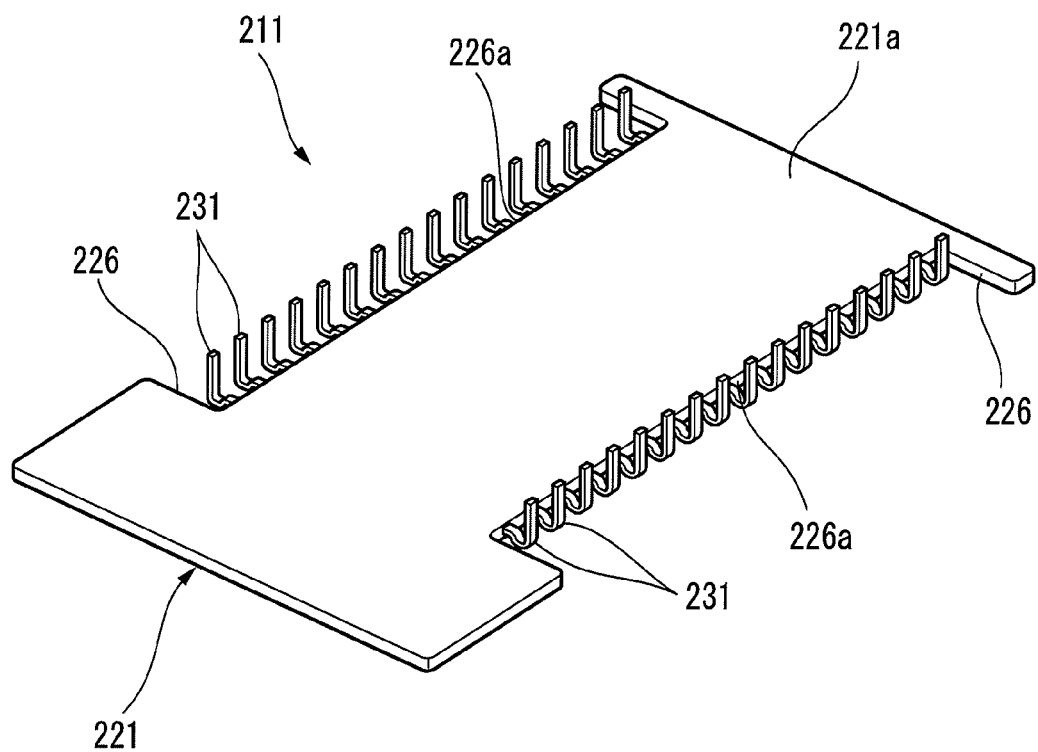
FIG. 34 is a perspective view of a wiring substrate according to an sixth embodiment of the invention.
Figure 35:
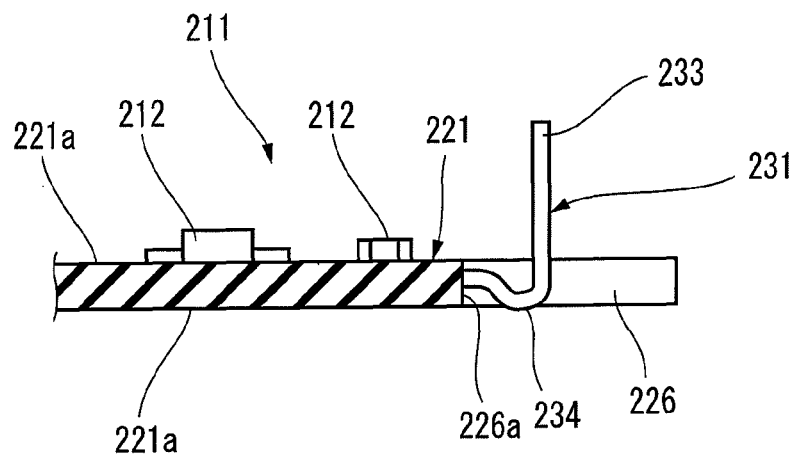
FIG. 35 is a cross-sectional view illustrating a part of the wiring substrate according to the sixth embodiment of the invention.
Figure 36:
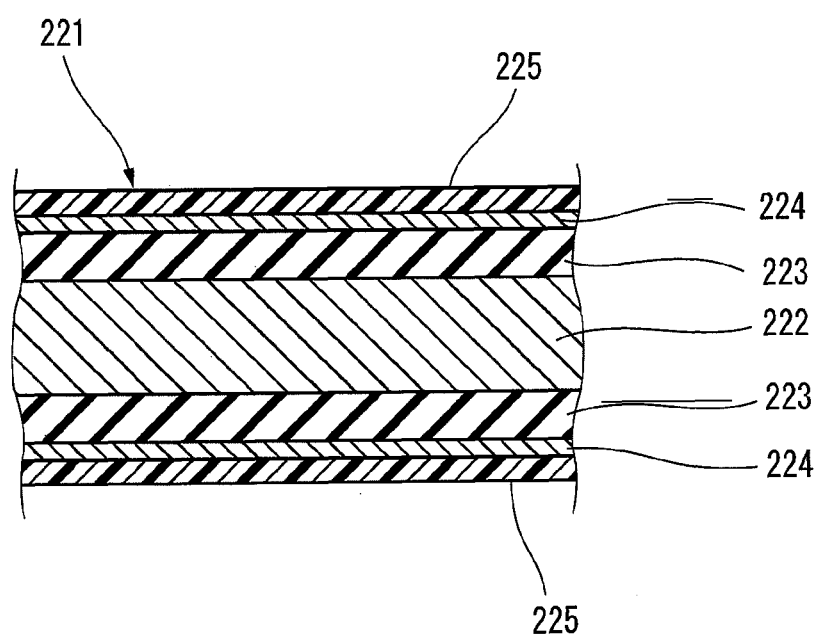
FIG. 36 is a cross-sectional view illustrating a structure of a substrate which forms a wiring substrate.
Figure 37:
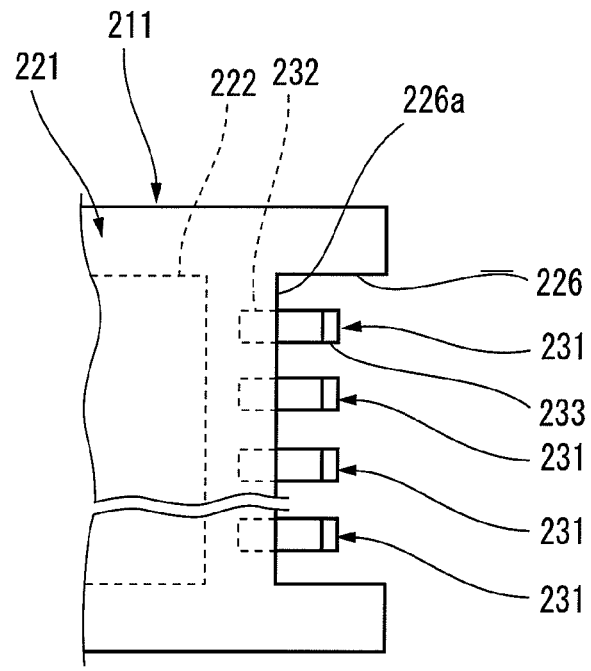
FIG. 37 is a plan view illustrating a part of the wiring substrate.

FIG. 34 is a perspective view of a wiring substrate according to an embodiment of the invention, FIG. 35 is a cross-sectional view illustrating a part of the wiring substrate according to the embodiment of the invention, FIG. 36 is a cross-sectional view illustrating a structure of a substrate which forms a wiring substrate, and FIG. 37 is a plan view illustrating a part of the wiring substrate.

As shown in FIGS. 34 and 35, a wiring substrate 211 in this embodiment includes a substrate 221 and a plurality of connection terminals 231 which are disposed on the substrate 221.

As shown in FIG. 36, the substrate 221 includes a plate-shaped metal core (high thermal conductive layer) 222 which is formed of copper, copper alloy or the like in the center in a thickness direction, and insulation layers 223 which are formed of synthetic resin having thermosetting and insulating properties on front and rear surfaces of the metal core 222. Further, a circuit pattern 224 is formed on a surface of the insulation layer 223, and a surface of the circuit pattern 224 is covered by a resist layer 225. That is, the substrate 221 is a metal core substrate having high heat radiation and heat distributing properties by installation of the metal core 222, its front and rear surfaces are formed as mounting surfaces 221a having the circuit patterns 224, as shown in FIG. 35. A variety of electric and electronic components 212 are mounted on the mounting surface 221a. Heat of the electric and electronic components 212 generated in the substrate 221 which is the metal core substrate is smoothly distributed by the metal core 222 and is radiated outside.

As shown in FIGS. 34 and 37, a concave section 226 is respectively formed on opposite side edge parts of the substrate 221, and the plurality of connection terminals 231 is extended in an aligned state from a side surface portion 226a of the concave section 226 in a length direction. The connection terminals 231 are electrically connected with the circuit patterns 224 by through-holes (not shown) formed in the substrate 221, for example.

Since the connection terminal 231 is made of the same conductive metallic material as the metal core 222, such as copper or copper alloy, the connection terminal 231 is disposed and fixed between the insulation layers 223, and is formed in the same layer as the metal core 222.

As shown in FIGS. 35 and 37, the connection terminal 231 includes a fixing section 232 which is fixed to the substrate 221 and a terminal section 233 which is extended from the side surface portion 226a of the concave section 226. The terminal section 233 bends upward to be perpendicular to the surface of the substrate 221, and the bending portion of the terminal section 233 of the connection terminal 231 is formed as a curved section 234 which is formed in an arc shape when seen from a side surface. Here, the connection terminal 231 is disposed in the concave section 226 of the substrate 221 so that the terminal section 233 thereof is positioned inside the side surface of the substrate 221.

In the wiring substrate 211 having such a configuration, for example, the connection terminal 231 is connected to another wiring substrate, or a component such as a connector is installed to the connection terminal 231.

According to the wiring substrate 211, the connection terminal 231 is extended from the side surface portion 226a of the concave section 226, it is possible to reliably suppress occupation of the mounting surface 221a by the connection terminal 231 to thereby reduce the size, compared with the case where the connection terminal 231 is installed on the mounting surface 221a. Further, for example, even in a case where a component such as a connector is installed to the connection terminal 231, since the component can be disposed in the concave section 226, it is possible to suppress the height, compared with the case where the component is disposed on the mounting surface 221a. That is, applicability to a device or the like is enhanced, and thus, it is possible to provide a wiring substrate suitable for a device which is required to be made smaller in size and thinner in thickness.

Further, according to the wiring substrate 211, since the connection terminal 231 bends in a direction perpendicular to the surface of the substrate 221 from the side surface portion 226a of the concave section 226 and the bending portion forms the curved section 234 which bends in the arc shape when seen from the side surface, external forces or stress applied to the connection terminal 231 can be desirably absorbed by the curved section 234. For example, even though a device which accommodates the wiring substrate 211 may be mounted on a vehicle such as an automobile, vibrations generated while the vehicle is moving are smoothly absorbed by the curved section 234. Further, even though terminal deviations occur when the connection terminal 231 is connected to other components, stress occurring due to the terminal deviations is smoothly absorbed by the curved section 234.

As described above, since the curved section 234 is formed in the connection terminal 231, it is possible to prevent such a problem that excessive force is applied to the fixing portion of the connection terminal 231 to the substrate 221 or the connection locations through soldering or the like of the terminal section 233 of the connection terminal 231 that causes deterioration.

Figure 38:
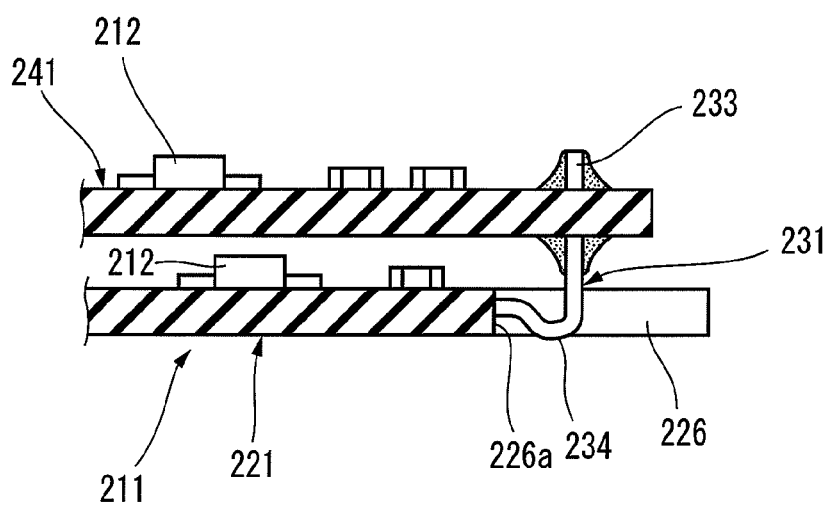
FIG. 38 is a cross-sectional view illustrating a part of the wiring substrate according to the sixth embodiment in which another wiring substrate is installed in parallel.

FIG. 38 illustrates a state where another wiring substrate 241 is installed in parallel with the wiring substrate 211 for connection. As shown in FIG. 38, the terminal section 233 of the connection terminal 231 of the wiring substrate 211 is connected by soldering or the like to another wiring substrate 241 which is installed in parallel at an interval to the substrate 221.

Here, since the connection terminal 231 of the wiring substrate 211 according to the invention is disposed in the concave section 226 as the connection terminal 231 is extended from the side surface portion 226a which forms the concave section 226 of the substrate 221 and the terminal section 233 bends in the direction perpendicular to the surface of the substrate 221, a connection position between the connection terminal 231 and another wiring substrate 241 can be set inside with reference to the edge portion of the wiring substrate 211, and thus, it is possible to install in parallel a wiring substrate 241 having the same size as the wiring substrate 211 or a wiring substrate 241 which is smaller in size than the wiring substrate 211, as another wiring substrate 241 which is installed in parallel to the wiring substrate 211, to thereby reduce the size.

Figure 39:
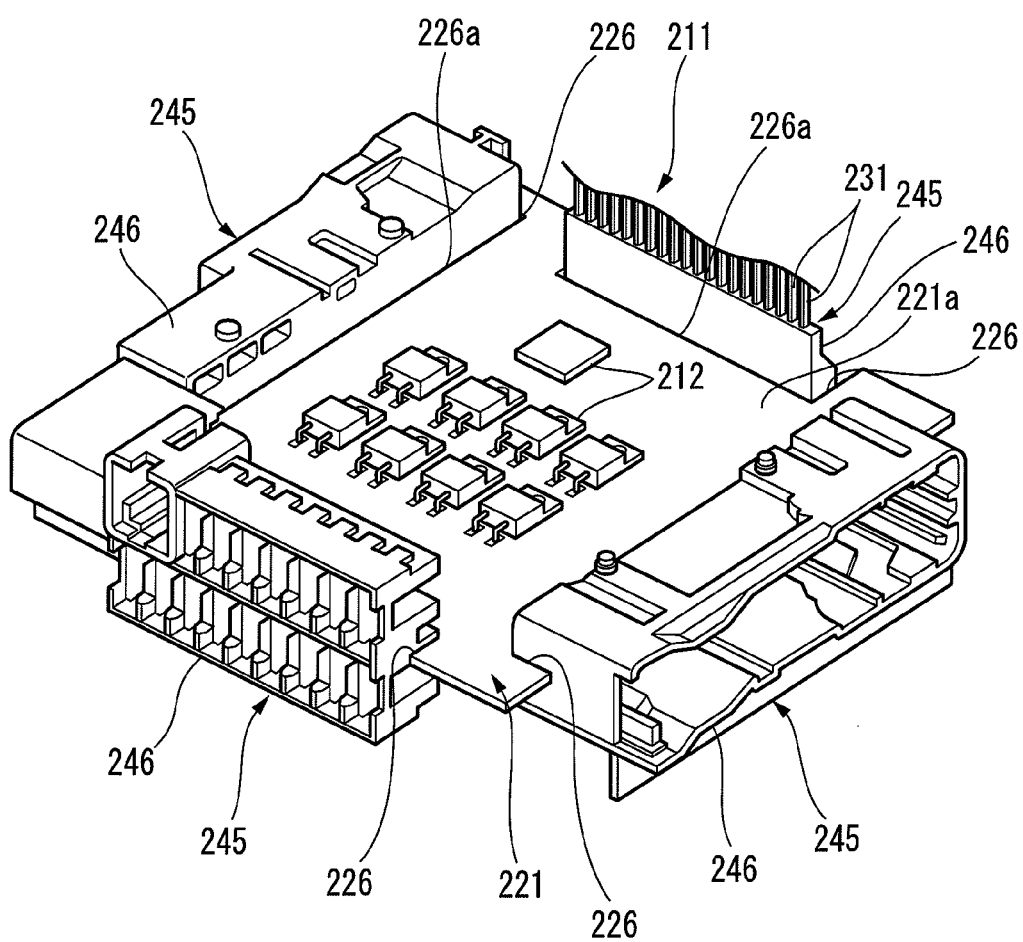
FIG. 39 is a perspective view illustrating the wiring substrate according to the sixth embodiment in which a connector is installed.

FIG. 39 is an example in which a connector 245 is installed to the wiring substrate 211. The connector 245 is connected to a corresponding connector which is installed in each electronic device, power source or the like. As shown in FIG. 39, in the wiring substrate 211, the concave section 226 is formed in four peripheral edge sides, and a housing 246 which forms the connector 245 is disposed in the concave section 226. Further, the connection terminal 231 which is extended from the side surface portion 226a of the concave section 226 is accommodated in the housing 246. In this way, according to the wiring substrate 211 in which the housing 246 of the connector 245 is installed in the concave section 226, it is possible to obtain a thinner thickness by suppressing the height. For example, in a case where the housing 246 is disposed on the mounting surface 221a, the height becomes equal to or higher than the thicknesses of the substrate 221 and the housing 246, but in the wiring substrate 211 in this embodiment, it is possible to suppress the height by only the thickness of the housing 246.

According to the wiring substrate 211, if the plurality of concave sections 226 is formed at the edges of the substrate 221 and the connection terminals 231 are installed in the concave sections 226, it is possible to simultaneously install another wiring substrate 241 and the connector 245 to the wiring substrate 211. For example, two wiring substrates 211 according to the invention may be used, the concave sections 226 of one of the wiring substrates 211 may be disposed to face each other, and the other one of the wiring substrates 211 may be connected to the connection terminals 231 installed in parallel to the concave sections 226, to thereby install the wiring substrates. Further, the connectors 245 may be installed to the concave sections 226 of the other one of the wiring substrates 211.

Next, a modification of the wiring substrate 211 in which a connection work with another wiring substrate 241 can be easily performed will be described.

Figure 40:
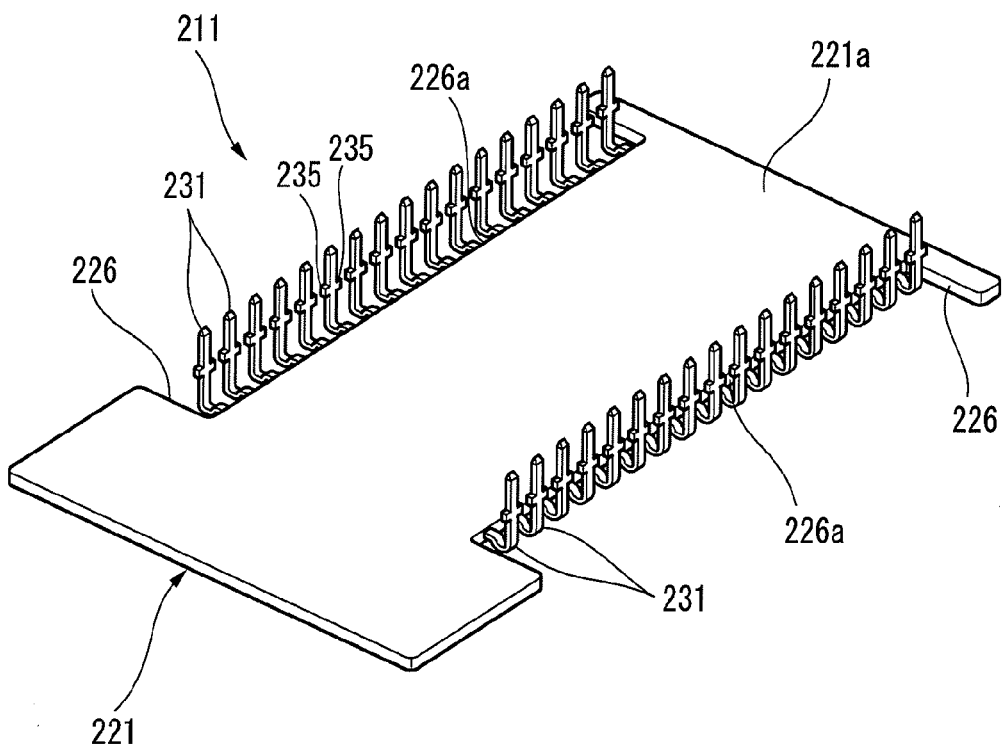
FIG. 40 is a perspective view illustrating a wiring substrate according to a modification of the sixth embodiment of the invention.
Figure 41:
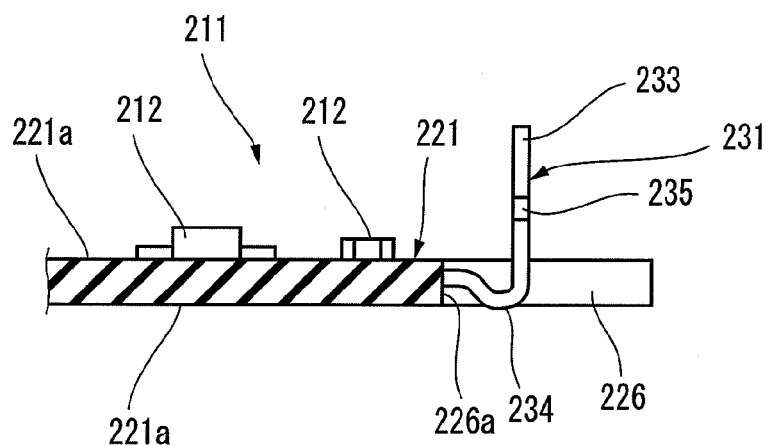
FIG. 41 is a cross-sectional view illustrating a part of the wiring substrate according to a modification of the sixth embodiment of the invention.
Figure 42:
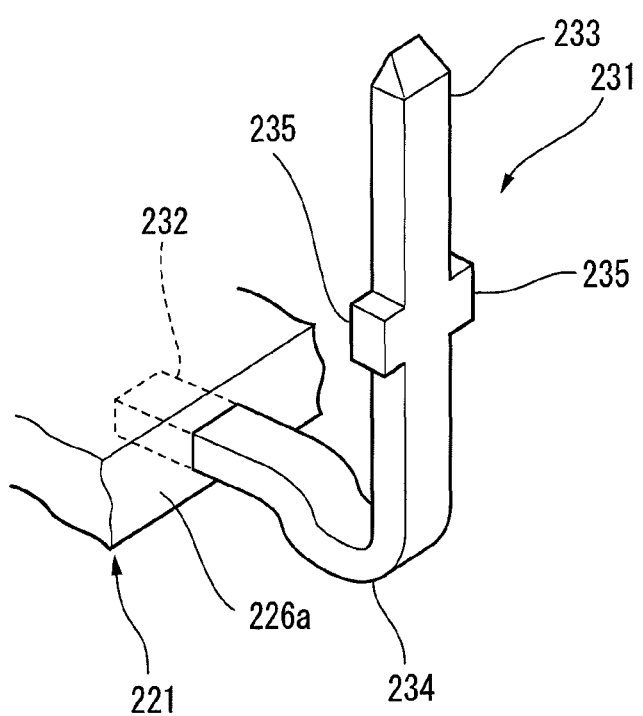
FIG. 42 is a perspective view in a connection terminal section of the wiring substrate according to the modification of the sixth embodiment.
Figure 43A:
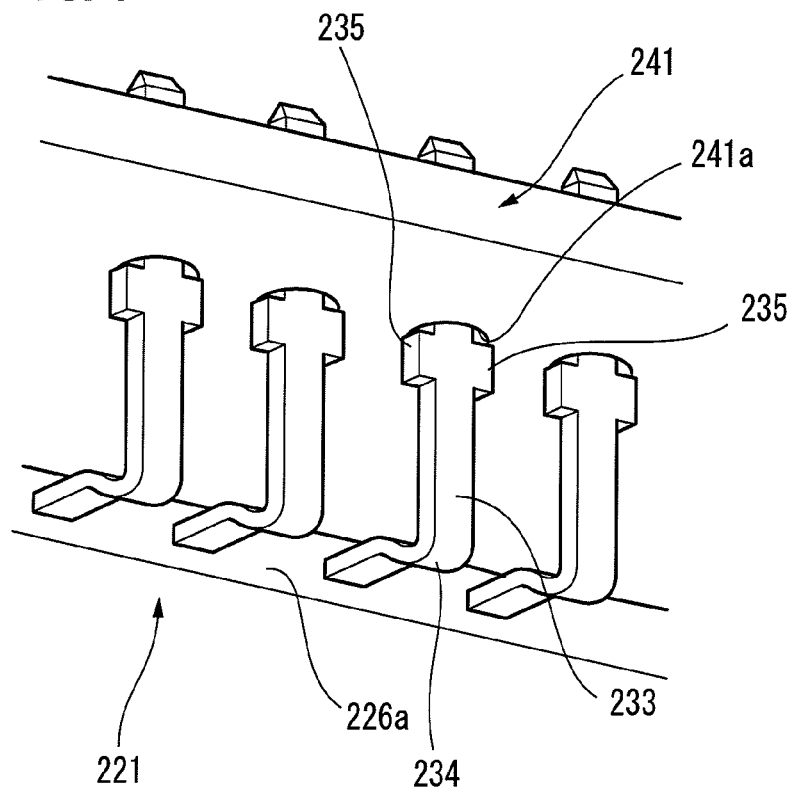
Figure 43B:
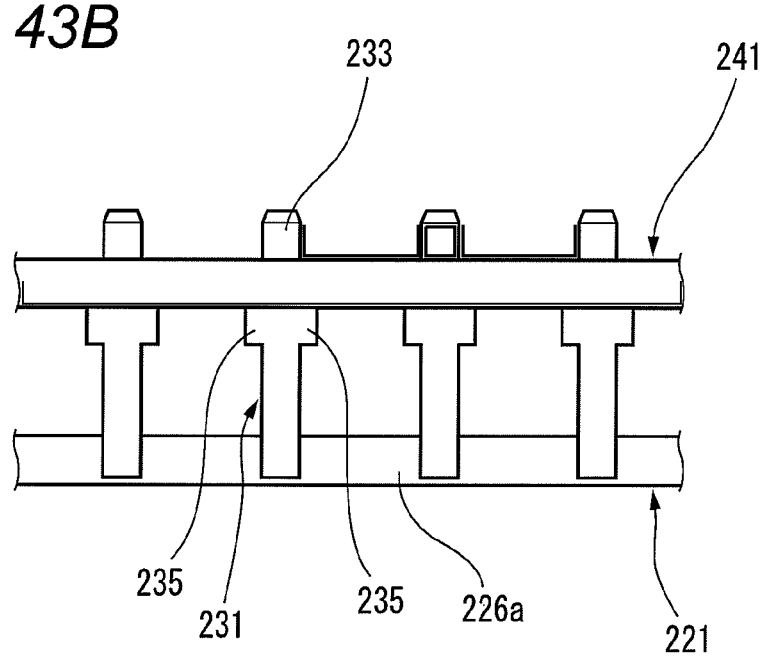
Figure 44:
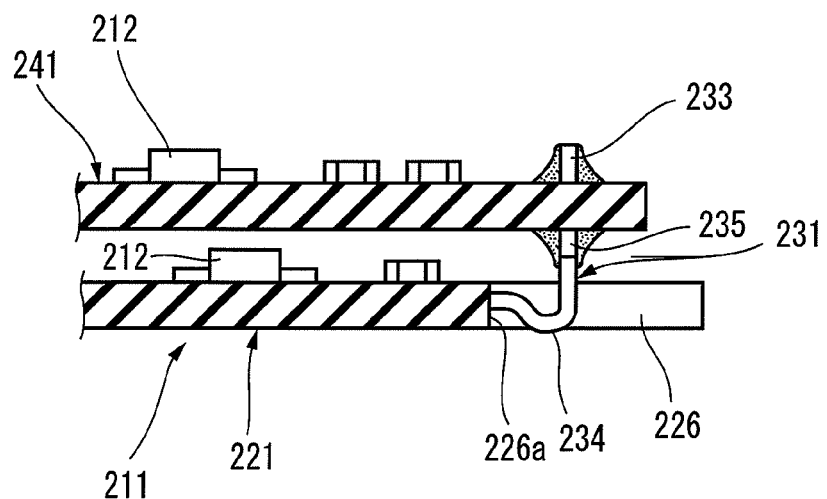
FIG. 44 is a cross-sectional view illustrating a part of the wiring substrate according to the modification of the sixth embodiment in which another different wiring substrate is installed in parallel.

FIG. 40 is a perspective view illustrating a wiring substrate according to a modification of the embodiment of the invention, FIG. 41 is a cross-sectional view illustrating a part of the wiring substrate according to the modification of the embodiment of the invention, FIG. 42 is a perspective view in a connection terminal section of the wiring substrate according to the modification of the invention, FIGS. 43A and 44B are diagrams illustrating a state where another wiring substrate is installed in parallel with the wiring substrate according to the modification of the invention, in which FIG. 43A is a perspective view when seen from a lower side in a support location of another wiring substrate and FIG. 43B is a side view thereof, and FIG. 44 is a cross-sectional view illustrating a part of the wiring substrate according to the modification of the embodiment in which another wiring substrate is installed in parallel.

As shown in FIGS. 40 and 41, in the wiring substrate 211, a concave section 226 is respectively formed on opposite side edge parts of the substrate 221, and the plurality of connection terminals 231 are extended in an aligned state from a side surface portion 226a of the concave section 226 in a longitudinal direction.

As shown in FIG. 42, support pieces 235 are integrally formed with the terminal section 233 of the connection terminal 231. Since the support pieces 235 are formed in the terminal section 233 of the connection terminal 231 by a press working, the support pieces 235 protrude in the side direction from opposite side parts of the terminal section 233.

The support piece 235 is positioned so that an upper position thereof corresponds to a position in which a lower surface of another wiring substrate 241 facing the substrate 221 is disposed when another wiring substrate 241 is installed in parallel to the wiring substrate 211. Further, as shown in FIG. 43A, the width of the terminal section 233 in a position where the support piece 235 formed is larger than the diameter of a through-hole 241a of the wiring substrate 241 into which the terminal section 233 is inserted.

Accordingly, if the terminal section 233 of the connection terminal 231 is inserted into the through-hole 241a of another wiring substrate 241, as shown in FIGS. 43A and 43B, another wiring substrate 241 is locked to the support piece 235, and the movement toward a base side of the terminal section 233 with reference to the locking position is controlled. Thus, another wiring substrate 241 is positioned in a position at a predetermined interval with respect to the substrate 221 of the wiring substrate 211.

Here, in a case where another wiring substrate 241 is installed in parallel to the wiring substrate 211, it is necessary to connect another wiring substrate 241 to the terminal section 233 by soldering in a state where another wiring substrate 241 is positioned at the predetermined interval with respect to the substrate 221. In this respect, in the wiring substrate 211 including the connection terminal 231 which does not have the support pieces 235, another wiring substrate 241 should be held in a predetermined position with respect to the substrate 221 using a component such as a spacer or a jig, in the connection process between the terminal section 233 and another wiring substrate 241 through soldering.

In contrast, as described above, according to the wiring substrate 211 including the connection terminal 231 having the support pieces 235, it is possible to support another wiring substrate 241 in a state where another wiring substrate 241 is locked to the support pieces 235 and is positioned at the predetermined interval with respect to the substrate 221 of the wiring substrate 211, without using a component such as a spacer or a jig. Thus, as shown in FIG. 44, in a case where another wiring substrate 241 is installed in parallel to the wiring substrate 211, it is possible to easily dispose another wiring substrate 241 in a position at the predetermined interval with respect to the wiring substrate 211 for connection with the connection terminal 231 through soldering. Accordingly, it is possible to reduce time for the connection work of another wiring substrate 241 to thereby reduce the manufacturing cost.

Further, as the support pieces 235 are formed in the connection terminal 231, a surface area of a portion where the connection terminal 231 is exposed outside is enlarged, and thus, it is possible to enhance a heat radiation property.

Figure 45:
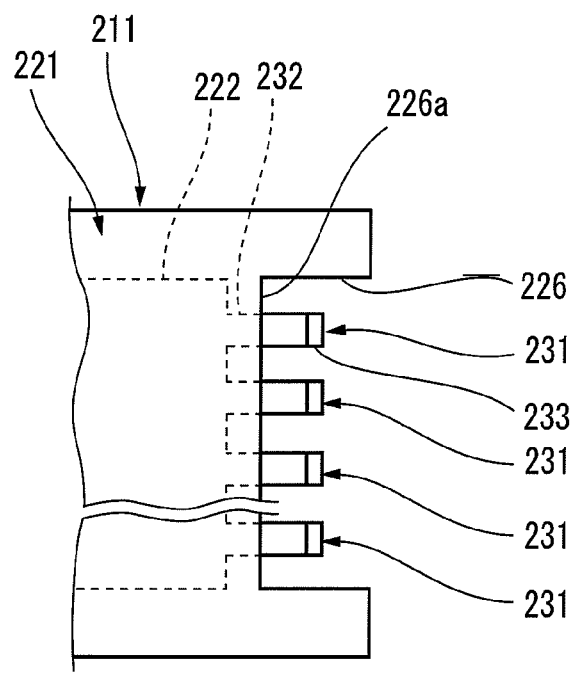
FIG. 45 is a plan view illustrating a part of the modification of the wiring substrate.

In the wiring substrate 211, the example in which the connection terminal 231 is separated from the metal core 222 is described, but as shown in FIG. 45, the connection terminal 231 may be integrally formed with the metal core 222. In the wiring substrate 211 having the connection terminal 231 which is integrally formed with the metal core 222, the connection terminal 231 is formed in a part of the metal core 222, the connection terminal 231 is extended from the side surface portion 226a of the concave section 226 in the side direction. In the connection terminal 231 which is integrally formed with the metal core 222 as described above, for example, it is possible to use the metal core 222 as a ground, and to easily use the connection terminal 231 as a ground terminal.

Figure 46:
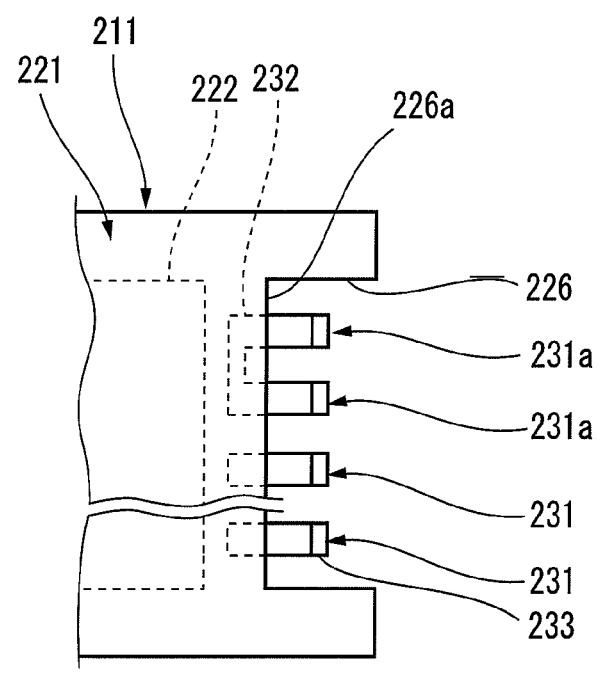
FIG. 46 is a plan view illustrating a part of the modification of the wiring substrate.

Further, as shown in FIG. 46, as the wiring substrate 211, at least two connection terminals 231a in the plurality of connection terminals 231 may be integrally formed to be electrically connected inside the substrate 221. If at least two connection terminals 231a in the connection terminals 231 are configured to be electrically connected, it is not necessary to arrange the circuit pattern for connecting two connection terminals on the surface of the substrate, and it is possible to reduce a space of the substrate on which a variety of components are mounted, and to achieve miniaturization of a wiring substrate.

Next, in a case where the wiring substrate 211 is manufactured, a structure which includes the connection terminal 231 separated from the metal core 222 will be described as an example.

FIGS. 47A to 47F are diagrams illustrating a manufacturing process of the wiring substrate, which are plan views and cross-sectional views of the wiring substrate which is being manufactured, respectively.

<Metal Core Working Process>

Figures 47A, 47B, 47C, 47D, 47E, 47F:
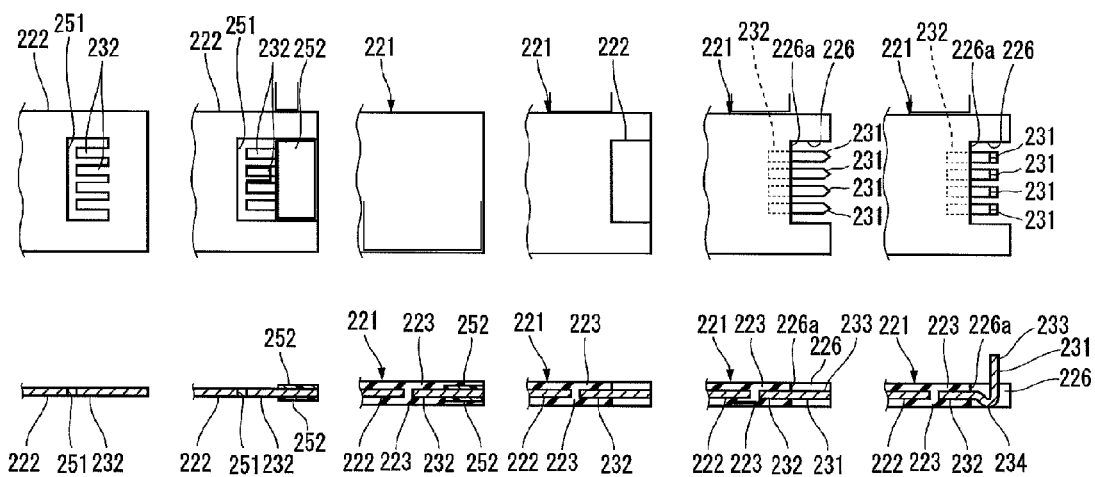
FIGS. 47A to 47F are diagrams illustrating a manufacturing process of the wiring substrate according to the invention, which are plan views and cross-sectional views of the wiring substrate which is being manufactured, respectively.
Figure 48:
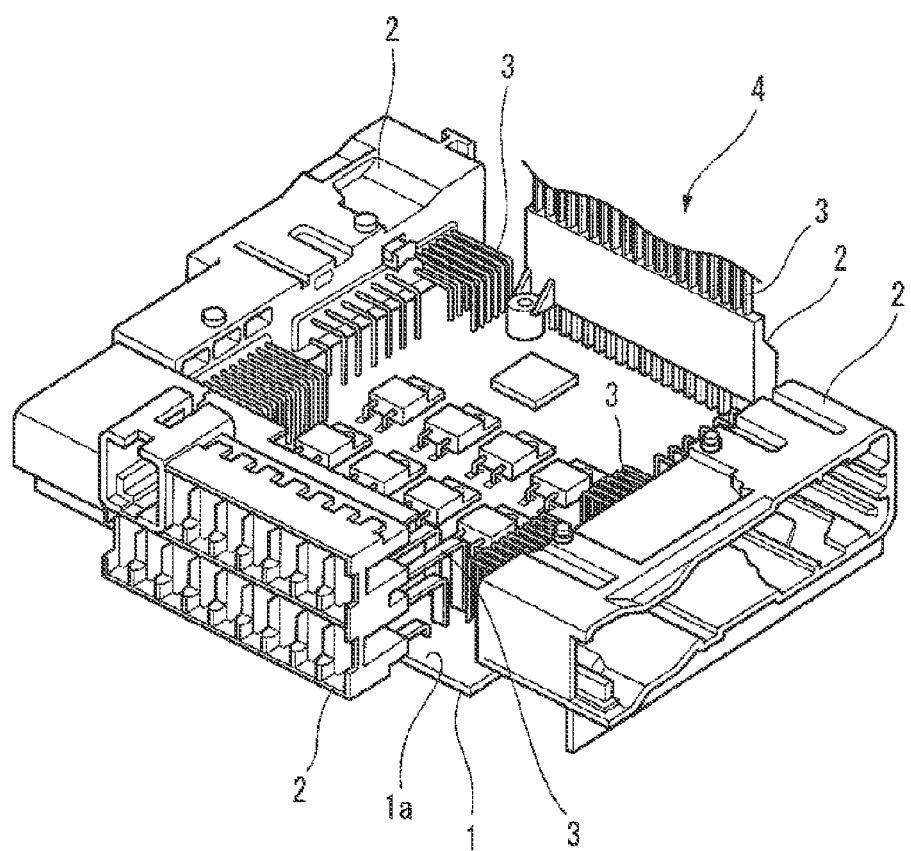
FIG. 48 is a perspective view illustrating an embodiment of a wiring substrate in the related art.

Firstly, as shown in FIG. 47A, a press working is performed to the metal core 222 of a flat panel shape, to thereby form an opening section 251 having the fixing section 232 of the connection terminal 231.

<Masking Process>

As shown in FIG. 47B, heat-resisting masking tape 252 is attached to the front and rear surfaces of the metal core 222 in a portion where the concave section 226 is to be formed.

<Substrate Forming Process>

The front and rear surfaces of the metal core 222 are surface-roughened by sandblasting, for example, and then, as shown in FIG. 47C, the insulation layers 223 are stacked on the front and rear surface of the metal core 222 to form the substrate 221. Thus, the opening section 251 is blocked by the insulation layers 223. At this time, the portion where the concave section 226 is to be formed is protected by the masking tape 252, and thus does not undergo the surface-roughening due to the sandblasting. Further, the insulation layer 223 is not attached to the portion where the concave section 226 is to be formed.

<Metal Plate (High Thermal Conductive Layer) Exposing Process>

As shown in FIG. 47D, the insulation layers 223 in the portion where the concave section 226 is to be formed, to which the masking tape 252 is attached, are removed by a spot facing or the like, and then the metal core 222 is exposed by peeling off the masking tape 252.

<Connection Terminal Forming Process>

As shown in FIG. 47E, the concave section 226 and the terminal section 233 of the connection terminal 231 are formed by processing the exposed metal core 222 by a press working, a cutting process using a router, or the like. Then, a plating process is performed in the terminal section 233 of the formed connection terminal 231.

<Connection Terminal Working Process>

Finally, as shown in FIG. 47F, the connection section 233 of the connection terminal 231 is formed in a predetermined shape by a press working or the like. Specifically, the curved section 234 is formed by bending the connection section 233 toward one surface side of the substrate 221 and by curving a portion which is a location of the bending portion.

According to the above-described process, it is possible to easily manufacture the wiring substrate 211 capable of being made smaller in size and thinner in thickness, in which its front and rear surfaces are formed as the mounting surfaces 221a, the concave section 226 is formed in the edge part, and the connection terminal 231 is extended from the side surface portion 226a of the concave section 226.

In a case where the wiring substrate 211 (refer to FIG. 45) in which the connection terminal 231 is integrally formed with the metal core 222 is manufactured, the metal core working process is omitted.

Further, in a case where the support pieces 235 are formed in the connection terminal 231, it is possible to form the terminal section 233 in which the support pieces 235 protrude in opposite side directions, in the connection terminal forming process.

As described above, as the support pieces 235 are formed in the terminal section 233, only by bending the connection terminal 231 toward one surface side of the substrate 221 in the subsequent connection terminal working process, it is possible to easily manufacture the wiring substrate 211 in which another wiring substrate 241 can be positioned for easy connection.

The present invention is not limited to the above-described embodiments, and modifications, and alterations may be appropriately made. Further, materials, shapes, sizes, numbers, arrangement positions and the like of a variety of components in the above-described embodiments are arbitrary and are not limitative, as long as they represent the spirit of the present invention.

What is claimed is:

1. A wiring substrate comprising:
a substrate having a high thermal conductive layer, in which at least one of a front surface and a rear surface of the substrate is a mounting surface for a variety of components;
a window section formed in the substrate;
and a connection terminal extended from and protruding within an inside surface portion of the window section and bending in a direction perpendicular to a surface of the substrate, the inside surface portion being perpendicular to the front and rear surface of the substrate, a portion of the connection terminal protruding within the inside surface portion being completely surrounded by the substrate,
wherein the window section has a predetermined height in the direction perpendicular to the surface of the substrate,
wherein the portion of the connection terminal protrudes from the window section at a position which is substantially at a center of the predetermined height,
wherein the window section is a continuous opening, throughout the substrate, from the front surface to the rear surface, and
wherein the window section is formed entirely within the substrate such that all sides of the window section are surrounded by a portion of the substrate extending from the front surface to the rear surface at the predetermined height.

2. The wiring substrate according to claim 1, wherein the substrate includes a metal core substrate in which insulation layers are formed on the front and rear of a metal core which is the high thermal conductive layer.

3. The wiring substrate according to claim 1, wherein a bending portion of the connection terminal is a curved section which bends in an arc shape when seen from a side surface thereof.

4. The wiring substrate according to claim 1, wherein a plurality of the connection terminals are installed in the inside surface portion of the window section in a longitudinal direction, and at least two connection terminals of the plurality of the connection terminals are electrically connected with each other inside the substrate.

5. The wiring substrate according to claim 1, wherein the high thermal conductive layer and the connection terminal are formed in the same layer.

6. The wiring substrate according to claim 1, wherein the connection terminal is connected to another wiring substrate which is installed in parallel at an interval with respect to the substrate.

* * * * *